(12) United States Patent
Le Guillou

(10) Patent No.: US 7,554,474 B2
(45) Date of Patent: Jun. 30, 2009

(54) FEEDFORWARD SIGMA-DELTA AD CONVERTER WITH AN OPTIMIZED BUILT-IN FILTER FUNCTION

(75) Inventor: Yann Le Guillou, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/096,210

(22) PCT Filed: Dec. 4, 2006

(86) PCT No.: PCT/IB2006/054571

§ 371 (c)(1), (2), (4) Date: Jun. 5, 2008

(87) PCT Pub. No.: WO2007/066273

PCT Pub. Date: Jun. 14, 2007

(65) Prior Publication Data

US 2008/0309535 A1  Dec. 18, 2008

(30) Foreign Application Priority Data

Dec. 5, 2005  (EP) ................................. 05301002

(51) Int. Cl.
*H03M 3/00* (2006.01)
(52) U.S. Cl. ........................ 341/143; 341/155
(58) Field of Classification Search ............... 341/155, 341/144, 143, 139
See application file for complete search history.

(56) References Cited

U.S. PATENT DOCUMENTS 6,940,436 B2 * 9/2005 Hezar et al. .................. 341/143
6,954,159 B1 * 10/2005 Cooper et al. ............... 341/143
7,034,730 B2 * 4/2006 Siferd et al. ................ 341/143
7,411,534 B1 * 8/2008 Melanson .................... 341/131

OTHER PUBLICATIONS

Schmiper, M; et al "A 3MW Continuous-Time /SPL Sigma//SPL Delta/-Modulator for Edge/GSM With High Adjacent Channel Tolerance" Proceedings of the 30th European Solid-State Circuits Conference, 2004. ESSCIRC 2004. Sep. 21, 2004, pp. 183-186.
Silva, J; et al "Wideband Low-Distortion Delta-Sigma ADC Topology" Electronics Letters, IEE Stevenage, GB, vol. 37, No. 12, Jun. 7, 2001, pp. 737-738.
Philips, K; et al "A Continuous-Time /SPL Sigma/SPL Delta/ADC With Increased Immunity to Interferers" IEEE Journal of Solid-State Circuits, vol. 39, No. 12, Dec. 2004, pp. 2170-2178.
Van Der Zwan, E; et al "A 0.2-MW CMOS /SPL Sigma/SPL Delta/ Modulator for Speech Coding With 80DB Dynamic Range" IEEE Journal of Solid-State Circuits, vol. 31, Issue 12, Dec. 1996, pp. 1873-1880.

* cited by examiner

*Primary Examiner*—Brian Young

(57) ABSTRACT

The present invention relates to a receiver apparatus, analog-to-digital converter apparatus, and method of converting an analog input signal into a digital output signal, wherein an additional direct feedforward path is introduced to compensate for peaking of feedforward structures while preserving frequency selectivity of the feedforward topology. In particular, the direct feedforward path (72) is provided with a scaling by a direct feedforward coefficient (ao) greater than zero and less than one. As a result, overshoot or peaking of classical feedforward topologies can be suppressed while providing interferer immunity, anti-aliazing effects and loop stability.

25 Claims, 21 Drawing Sheets

| Band | W-CDMA Rx | Where | ISM band alias at | |
|---|---|---|---|---|
| | | | mfs=312MHz | mfs=416MHz |
| I | 2110-2170 | EU/JP/APAC | Yes | No |
| II | 1930-1990 | AM | No | Yes |
| III | 1805-1880 | EU/JP/APAC | No | No |
| IV | 2110-2155 | AM | Yes | No |
| V | 869-894 | AM | No | No |
| VI | 875-885 | JP | No | No |
| 900 | 925-960 | EU (France) | No | No |
| 2600 | 2620-2690 | EU/AM | No | No |
| 2600 | 2655-2690 | JP/Korea | No | No |

FIG. 11

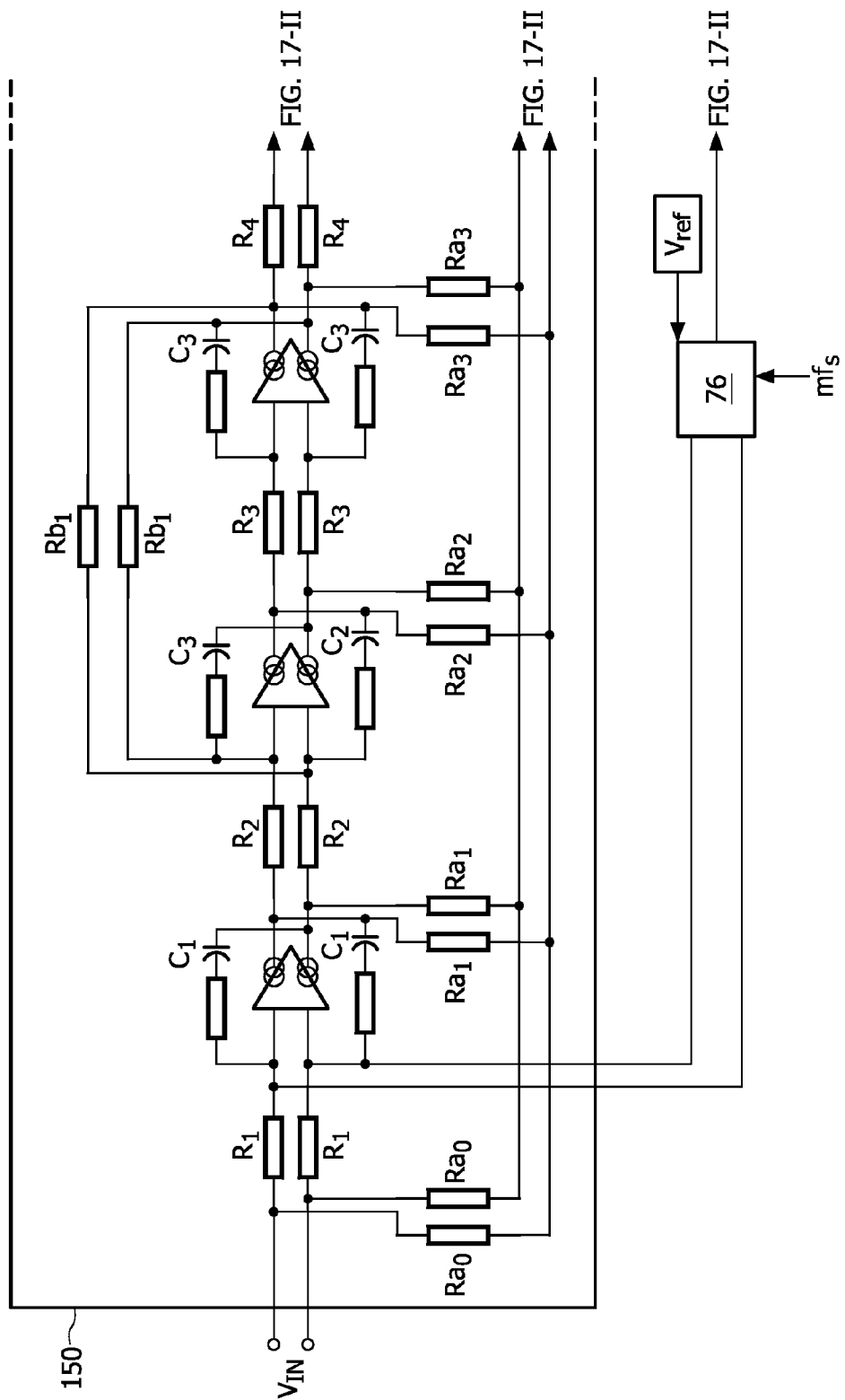
FIG. 17-I

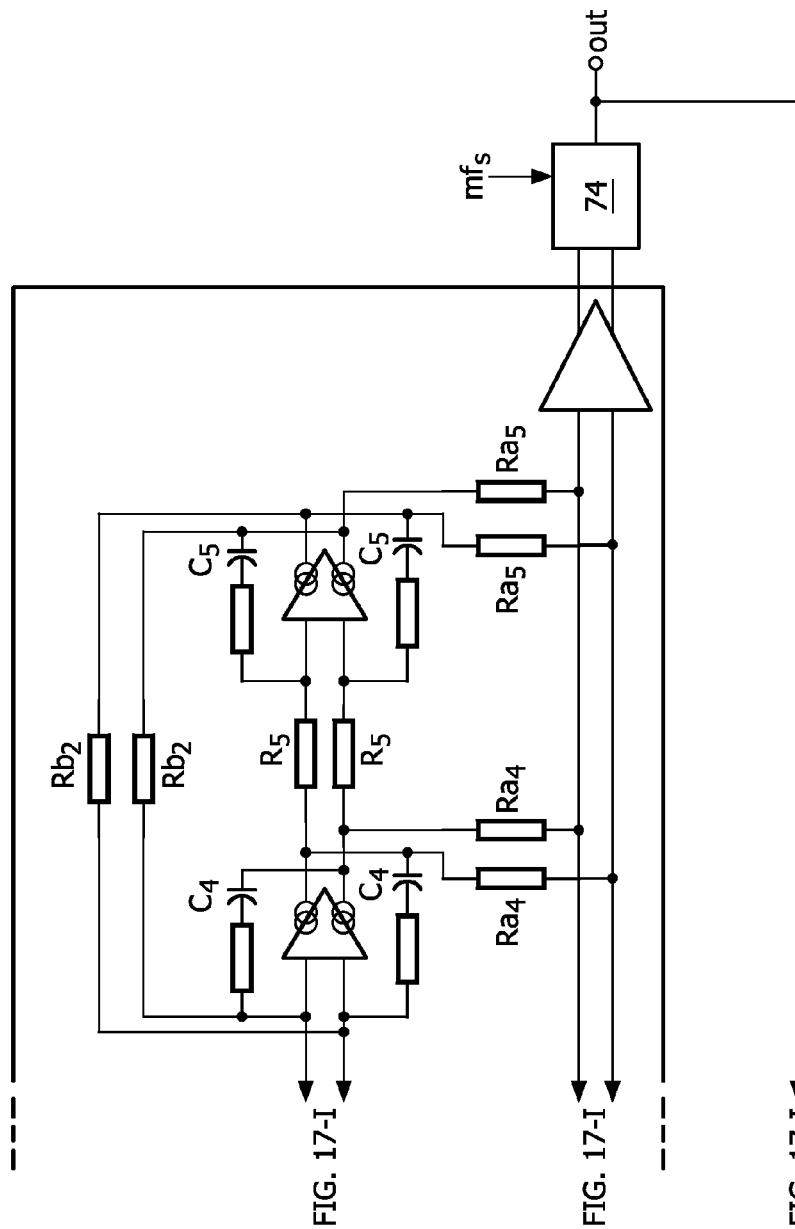
FIG. 17-II

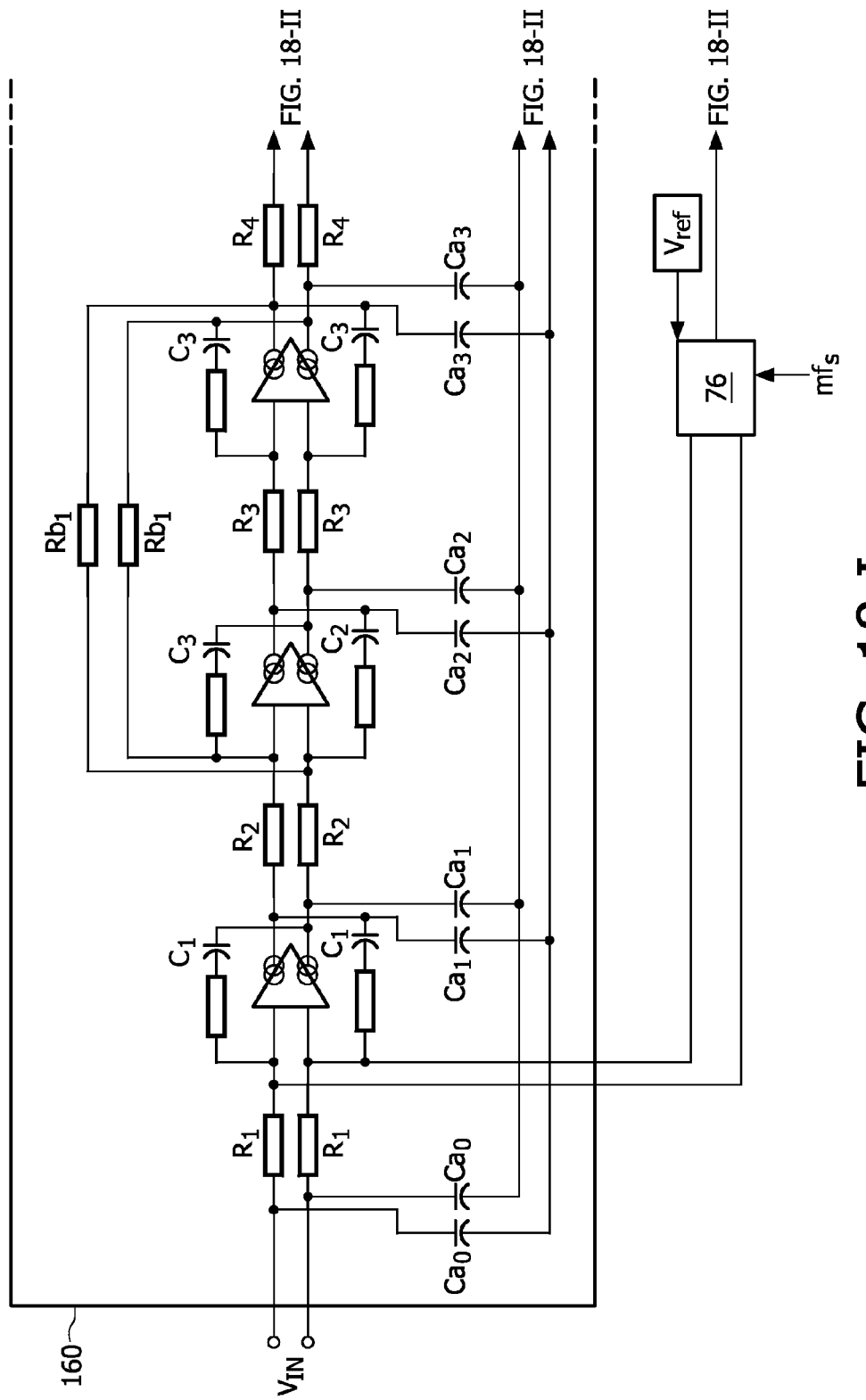
FIG. 18-I

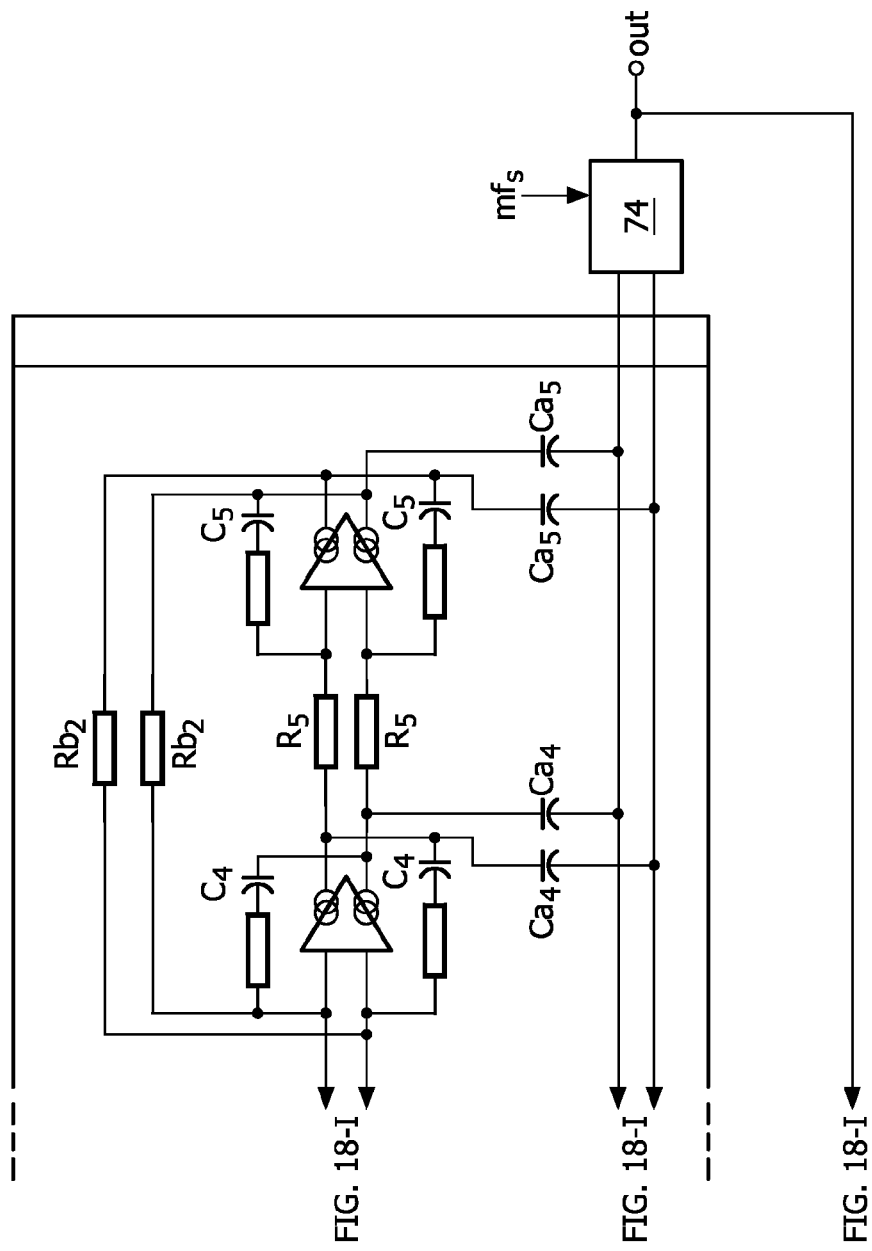
FIG. 18-II

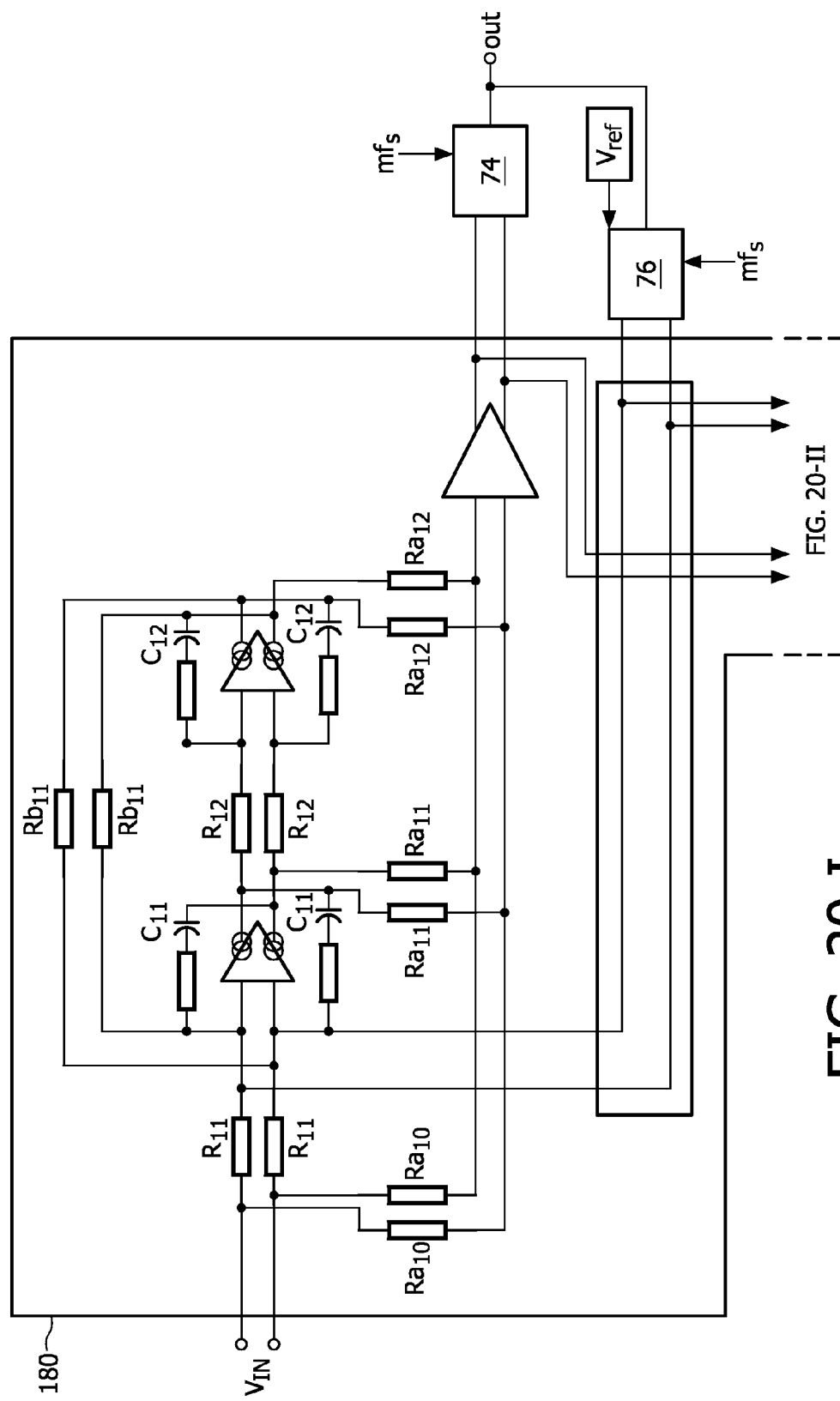
FIG. 20-I

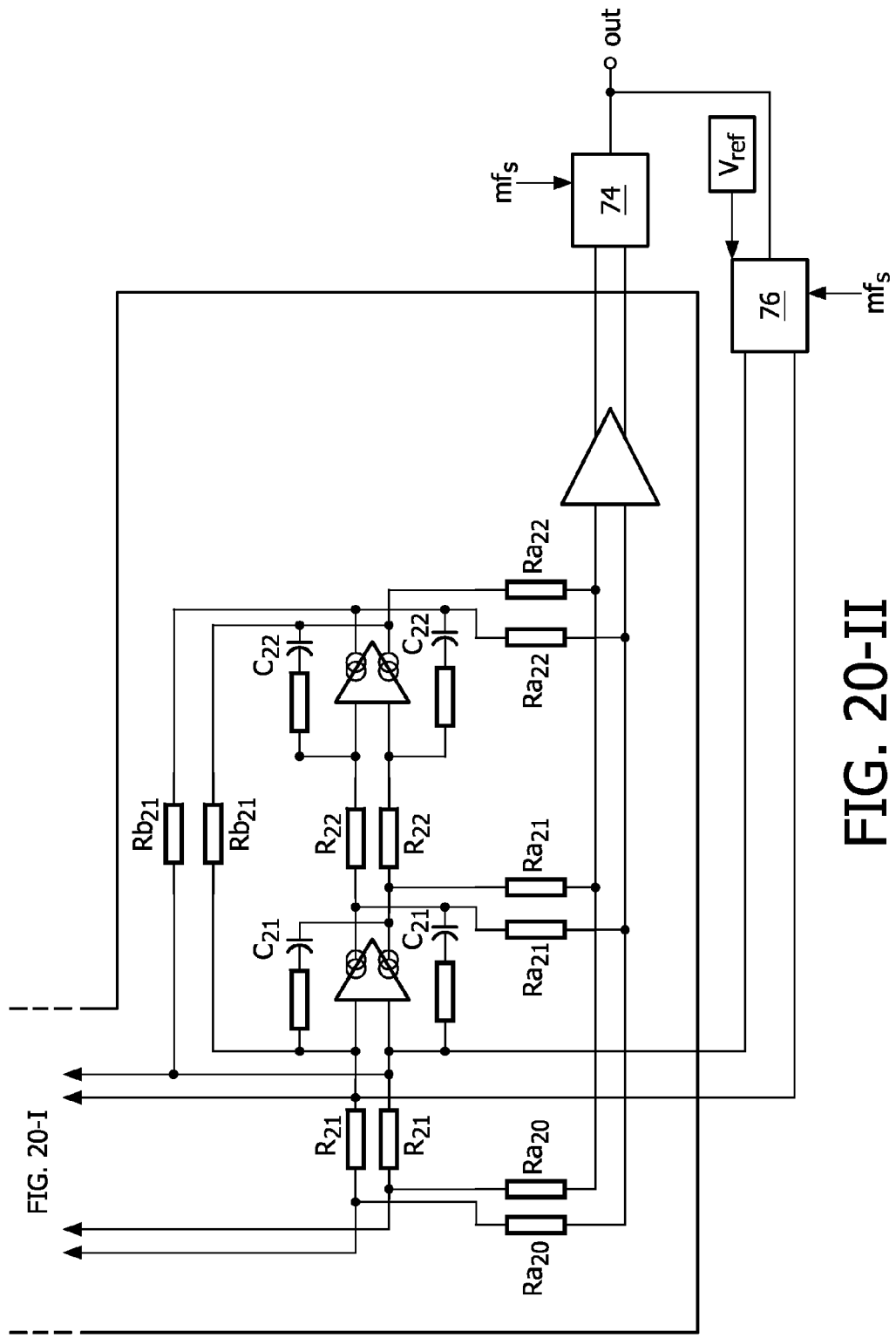
FIG. 20-II

| 1st stage | | 2nd stage | | remarks |
|---|---|---|---|---|
| 1st integrator | 2nd integrator | 1st integrator | 2nd integrator | |
| OTA-RC | OTA-RC | OTA-RC | OTA-RC | Low voltage, very linear |
| OTA-RC | Gm-C | Gm-C | Gm-C | Moderate voltage, low power consumption |

FEEDFORWARD SIGMA-DELTA AD CONVERTER WITH AN OPTIMIZED BUILT-IN FILTER FUNCTION

FIELD OF THE INVENTION

The present invention relates to an analog-to-digital converter (ADC) apparatus and method of converting an analog input signal into a digital output signal. More specifically, the present invention relates to a sigma-delta ADC which can be used in wireless receivers.

BACKGROUND OF THE INVENTION

Receivers for wireless communications are being digitized in the sense that analog selectivity is being exchanged for digital processing and the ADC is gradually moving more towards the antenna. Wireless interconnectivity (for example, Bluetooth and IEEE 802.11x) and wireless cellular (for example GSM/EDGE, UMTS) seem prime candidates for adopting full-digital implementation of receiver baseband processing. Broadcast digital television (TV) is also a prime candidate. This is especially true for mobile digital TV standards such as DVB-H, ISDB-T, T-DMB, DVB-T, MediFLO.

The performance of multistandard receivers is directly influenced by the performance of the ADC. This leads to more and more demanding specifications for the required ADCs. Intensive on-going research on sigma-delta modulators or converters show the potential of sigma-delta converters as the most promising candidate for high-speed, high-resolution and low-power mixed-signal interfaces.

The sigma-delta converter architecture takes a fundamentally different approach than other ADC architectures. Sigma-delta converters generally consist of an integrator, a quantizer and a single-bit digital-to-analog converter (DAC). The DAC output is subtracted from the input signal and the resulting signal is integrated. The comparator converts the integrator output voltage to a single-bit digital output, e.g. "1" or "0". The resulting bit becomes the DAC's input and the DAC's output is subtracted from the ADC's input signal. With such a sigma-delta architecture, the digital data from the ADC is a stream of ones and zeros, and the value of the signal is proportional to the density of digital "1"'s output by the quantizer. This bit stream data is then digitally filtered and decimated to result in a binary-format output. Thus, the sigma-delta converter circuit generates a 1-bit pulse density modulated (PDM) signal from an analog input signal. As an alternative, the sigma-delta converter circuit may as well generate a multi-bit output. This depends on the structure of the quantizer. If the quantizer is of a single-bit type, then the sigma-delta modulator generates a 1-bit output, but if the quantizer is of a multi-bit type, then the sigma-delta modulator generates a multi-bit stream. It creates fixed-width pulses in relation to the amplitude of the analog waveform. As the amplitude of the analog waveform rises, the first binary output value is produced. As it falls, the second binary output value is produced. If it remains neutral, alternating first and second binary output values are created.

The basic principle of sigma-delta converters involves trade-off between amplitude resolution and sampling rate. In contrast to other converter technologies such as Nyquist and Flash converters, sigma-delta converters sample signals much faster than the Nyquist sampling frequency (i.e. twice the bandwidth of the input signal). They offer high resolution achieved principally by their high-speed sampling combined with feedback, noise-shaping and digital filtering. Furthermore, sigma-delta converters offer the distinct advantage of lower power consumption. This is an important criterion especially with the proliferation of low-power mobile communication systems circuit, which means that the application areas for sigma-delta converters will grow.

FIG. 1 shows a schematic block diagram of a conventional highly analog receiver in which a radio frequency (RF) signal is received via an antenna and supplied via a low noise amplifier (LNA) 10 to a mixer circuit 20 where the received signal is converted to a low baseband frequency range. The baseband part of the receiver consists of an analog pre-filter section 30 which comprises a cascade of filter sections and programmable gain amplifiers (PGAs) required to limit the signal to a predefined level. The analog pre-filter section 30 is followed by a conventional sigma-delta ADC 40 which converts the analog input signal into a digital signal and supplies the digital signal to a digital filtering and scaling unit 50 from which it is supplied to a digital demodulation circuit 60.

However, the conventional architecture according to FIG. 1 leads to the disadvantage that the absence of preceding channel filtering implies that the input of the ADC 40 consists of both the wanted channel and a wide spectrum of possible interferer channels. As a consequence, both bandwidth and dynamic range of the ADC 40 must be extremely linear to prevent risk of intermodulation distortion by large interferers corrupting the reception of the wanted channel. As a result, energy consumption of the ADC 40 is high.

In view of the above disadvantage, Kathleen Philips et al., "A Continuous-Time ΣΔ ADC With Increased Immunity to Interferers", IEEE Journal of Solid-State Circuits, Vol. 39, No. 12, December 2004, presents a sigma-delta ADC with merged filtering and PGA. The described architecture describes a continuous-time sigma-delta ADC with a filtering signal transfer function (STF). This filtering STF makes the sigma-delta ADC immune to interferers even if they exceed the maximum allowable input level for the wanted channel.

FIG. 4 shows the STF of this conventional topology when designed for a GSM/EDGE application. It is flat within the conversion bandwidth, shows some overshoot for adjacent channels, and provides first-order filtering beyond the unity-gain frequency of the loop. The overshoot occurs due to the fast transition from $n^{th}$-order to $1^{st}$-order behavior of the open loop gain and leads to the problem that adjacent channels are amplified towards the output. Considering that the allowable output modulation depth is fixed, this means that the stable input range for adjacent channels is smaller than that for the wanted channel.

FIG. 3 shows a schematic functional diagram of a switched capacitor (i.e. discrete time in contrast to continuous-time) delta-sigma ADC topology with reduced sensitivity to operation amplifier non-linearities, as described for example in J. Silva et al. "Wideband low-distortion delta-sigma ADC topology", IEE Electronic letters, vol. 37, No. 12, $7^{th}$ June 2001. Basically, the input X(z) is directly connected via a feedforward path 71 to an input of a quantizer or comparator 74 in order to create a flat STF without filtering capabilities. The digital output signal Y(z) is fed back via a DAC 76 and subtracted from the input signal X(z). An integration part with two transfer functions $H_1(z)$ and $H_2(z)$ and a coefficient of value "2" integrates the subtraction output and supplies the integrated signal to a summing point where it is summed with the input signal X(z). However, due to the dispensed filtering capabilities of the ADC of this solution, sufficient analog pre-filtering must be provided to prevent interferer from overloading the sigma-delta ADC.

However, analog components are critical in the sense that they introduced noise and distortion and thus degrade the signal-to-noise ratio and hence the receiver sensitivity. Moreover, their offset and gain or phase error accumulates and a lot of calibration and control loops are needed for correction. This increases design time, complexity and risks. Thus, it is desirable to digitize the received signal as early as possible.

In E. van der Zwan, "A 0.2 mW CMOS ΣΔ modulator for speech coding with 80 dB Dynamic Range", IEEE. J. of Solid State Circuits; pp. 1873-1880 December 1996, a quantitative analysis of the anti-aliazing suppression of a continuous-time sigma-delta (ΣΔ) ADC is conducted. The described model captures feedforward and feedback sigma-delta topologies. It consists of a linear block comprising a loop filter transfer function G and two non-linear blocks: a 1-bit quantizer and a feedback DAC. An additional linearized model is described where the quantizer is replaced by a linearized gain c and an additive noise source Nq. a gain d, whereas the feedback DAC model is built with a linear gain d and a hold function.

Based on the linearized model, it is demonstrated that the alias component Zs at frequency Δf is attenuated by:

$$\left| \frac{G(mfs - \Delta f)}{G(\Delta f)} \right| \quad (1)$$

where |G(f)| stands for the magnitude at frequency f of the loop filter transfer function G.

Additional wireless transmission systems, such as Bluetooth, may need to operate concurrently to other standards, because the wireless link between the radio terminal and other peripherals cannot be halted when voice or data communications are active, e.g., Bluetooth allows the use of wireless headphones during a cellular phone call. As a consequence, some traffic will co-exist in the ISM band (Industrial, Scientific, and Medical band) and in the cellular bands at the same time. This also applies to broadcast digital TV with the emergence of TV on Mobile. It is noted that in a multi-mode/multi-band receiver, the ISM, UHF, and cellular bands data will be received on a common multi-band antenna as illustrated in a receiver architecture of FIG. 10. It is noted that the L-band and S-band are also used for TV on Mobile applications.

FIG. 10 shows a multi-mode/multi-band receiver concept built on multi-band antenna 12 and ZIF (Zero Intermediate Frequency) receiver 22 for a 3G communication pipe. Signals received via the multi-band antenna 12 are supplied to a filter bank 16 comprising parallel filters for different receiving bands (Bands I to IV, GSM, UMTS, Bluetooth). Although not shown in FIG. 10, filters for other receiving bands such as UHF (Ultra High Frequency) or other broadcast bands may be provided as well or as an alternative. Bluetooth signals received within the Bluetooth reception band and are supplied to a Bluetooth receiver 18. Other signals received within a predetermined frequency band manually selected by the selection switch 14 are received through the respective filter of the filter bank 16. Then, the received and filtered signal is amplified by a respective one of a plurality of Low Noise Amplifiers (LNAs) 10 and supplied to the ZIF receiver 22 for digital band selection, which comprises in-phase (I) and quadrature-phase (Q) mixers 20 for generating I and Q components of the received signal by using reference signals from a tunable local oscillator. The I and Q components are processed in respective tunable filters, sigma-delta ADCs, and decimation filters.

The so-called 3G DigRF standard imposes some data-rate constraints for the data transfer between the radio frequency integrated circuit (RF-IC) and the baseband integrated circuit (BB-IC) for 3G ($3^{rd}$ generation) standard, e.g., Universal Mobile Telecommunications System (UMTS), Code Division Multiple Access 2000 (CDMA2000), etc. As a result, 312 or 416 MHz sampling frequency (mfs) is required to clock the UMTS sigma-delta ADC. Consequently, some Bluetooth channels can alias in some cellular bands, i.e. can generate intermodulation frequencies within some cellular bands. For example, assuming that a Bluetooth channel is provided at 2404 MHz, a UMTS channel is provided at 1988 MHz (Band II) and the mfs is set at 416 MHz. The 2404 MHz Bluetooth channel is downconverted to 416 MHz (=2404 MHz-1988 MHz) by the UMTS ZIF (Zero Intermediate Frequency) receiver. During the A/D conversion process, the down-converted Bluetooth channel is sampled at mfs=416 MHz. By doing so, the frequency of the generated Bluetooth alias component is exactly on top of the frequency of the 3G wanted signal. Thus, without anti-aliazing (AA) filtering in front of the ADC, the SNR (signal-to-noise ratio) and BER (bit error rate) are seriously degraded.

FIG. 11 shows a table of cellular bands that can be potentially affected by SNR and BER limitations due to some ISM channel aliazing in the band of interest when the ADC is clocked at 312 MHz and 416 MHz. The following abbreviations are used in the table: EU=Europe, JP=Japan, APAC=Asia Pacific, AM=AMERICA. As indicated in the left two columns of the table, alias is generated in bands I and IV when the ADC is clocked at mfs=312 MHz and in band II when the ADC is clocked at mfs=416 MHz. It is worth noting that this issue concerns all locations in the world.

Generally speaking, co-existence of data traffic in cellular and ISM bands requires anti-aliazing means or provisions to be provided at the ADC.

SUMMARY OF THE INVENTION

It is an object of the present invention to provide an improved ADC architecture and method, by means of which analog pre-filtering and anti-aliasing requirements due to adjacent channel distortions can be relaxed while integrating the ADC as close as possible to the receiver input.

This object is achieved by an ADC apparatus as claimed in claim 1 and by an ADC method as claimed in claim 16.

Accordingly, compensation means which connect the input of the ADC to the summing point of the feedforward means are provided with a scaling functionality which leads to the advantage that overshoot in the STF can be prevented, to compensate for peaking of the feedforward means, while preserving first order high frequency selectivity of the whole feedforward topology, consisting of the feedword means and the compensation means. Thus, a new filtering feedforward topology is proposed. This enables considerable reduction of the analog pre-filtering requirements in front of the ADC without sacrificing low-power constraints. Interferer immunity at high frequencies is thus preserved and the ADC can be integrated closer to the receiver input, e.g. the antenna of a wireless receiver chain.

Additionally, the proposed method and apparatus provide some significant alias filtering so that the conventional anti-aliazing filter can be discarded. The alias suppression depends on the value of the scaling coefficient. The smaller this value, the stronger the alias is suppressed.

The compensating means may comprise a direct feedforward path. Thereby, the proposed solution can be implemented simply by providing an additional direct path between the input of the ADC and the output summing point of the feedforward means.

Furthermore, the predetermined filtering function of the feedforward means may have a low-pass characteristic. The scaling of the input signal provides the advantage that the STF of the feedforward means can be modified to reduce peaking, while maintaining a suitable low-pass filter characteristic. In particular, the scaling coefficient can be optimized in accordance with the input signal.

To improve selectivity while suppressing undesirable peaking, at least one of high-pass filter means for filtering the analog feedback signal and low-pass filter means for filtering the derived signal can be introduced. As an example, the high-pass filter means and the low-pass filter means may have the same cut-off frequency.

Additionally, anti-aliazing filter means may be provided for suppressing alias signals, wherein alias suppression of the anti-aliazing filter means can be set by the scaling coefficient. According to a specific example, the anti-aliasing filter means may comprise a fifth order loop filter. Furthermore, the anti-aliazing filter means may be based on at least one of an OTA and a gm-C topology. They may have a passive (purely resistive or purely capacitive) feedforward coefficient. The feedforward coefficient can also be built with active device such as transconductance (gm). As an example, the anti-aliasing filter means may be based on a cascaded loop implementation.

The proposed ADC apparatus can be incorporated or comprised in a receiver apparatus to thereby reduce pre-filtering requirements and increase robustness of the receiver circuitry. The receiver apparatus may be a multi-band receiver for combined reception of cellular and other wireless signals.

Further advantageous modifications of the proposed solution are defined in the dependent claims.

BRIEF DESCRIPTION OF THE DRAWINGS

The present invention will now be described based on preferred embodiments with reference to the accompanying drawings, in which:

FIG. 11 shows a table of cellular bands that can be potentially affected by limitations due to some channel aliazing;

FIG. 17 shows a schematic circuit diagram of an anti-aliazing filter according to a third preferred embodiment;

FIG. 18 shows a schematic circuit diagram of an anti-aliazing filter according to a fourth preferred embodiment;

FIG. 20 shows a schematic circuit diagram of an anti-aliazing filter according to a sixth preferred embodiment; and FIG. 21 shows a table listing situations for possible anti-aliazing loop filter implementations.

DESCRIPTION OF THE PREFERRED EMBODIMENTS

In the following, preferred embodiments of the present invention will be described in greater detail based on a sigma-delta ADC topology which can be used in a receiver architecture for GSM (Global System for Mobile communications) or EDGE (Enhanced Date rates for GSM Evolution).

As already mentioned, analog components are critical due to the fact that they introduce noise and distortion and thus degrade signal-to-noise ratio and hence receiver sensitivity, and require lots of calibration and control loops for correction. The preferred embodiments of the present invention provide the advantage of early digitization of the received signal, as illustrated in FIG. 2.

Figure 1:
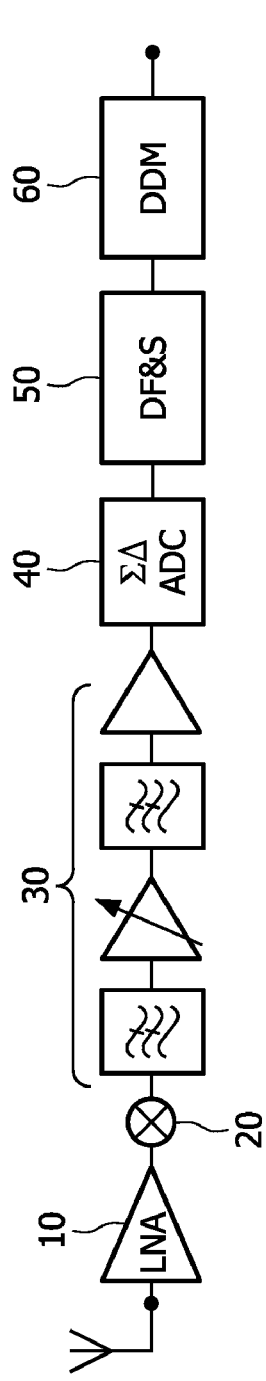
FIG. 1 shows a schematic block diagram of a conventional receiver architecture.
Figure 2:
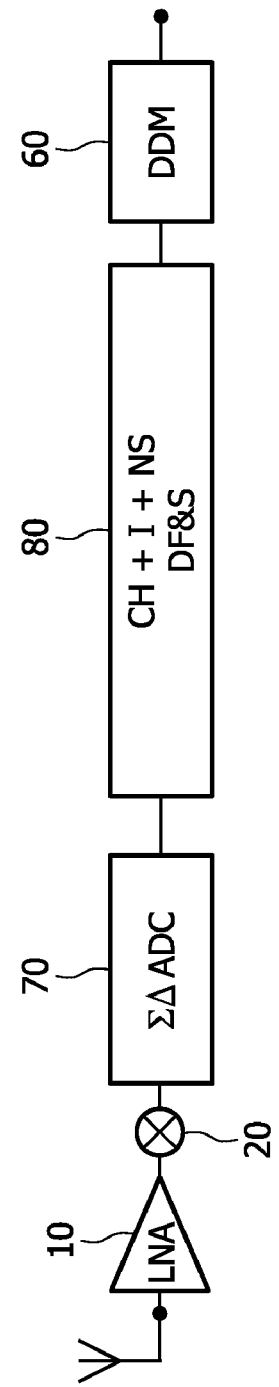
FIG. 2 shows a schematic block diagram of a receiver architecture in which the present invention can be implemented.

According to FIG. 2, an RF signal is received via an antenna and a LNA 10 and converted by a mixer circuit 20 into baseband frequency. Then, a sigma-delta ADC 70 according to the preferred embodiments is introduced at a very early stage, so that most of the signal processing is achieved in the digital domain and benefit can be taken of advances in digital technology, such as CMOS (Complementary Metal Oxide Semiconductor) technology. The proposed sigma-delta ADC 70 is adapted to provide enhanced interferer immunity so that pre-filtering requirements are reduced. The converted digital output signal is supplied to a digital processing circuit 80 responsible for selection, interferer suppression, noise shaping, digital filtering and scaling. The processed digital signal is then supplied to a digital demodulator 60 to obtain the originally transmitted information.

Figure 5:
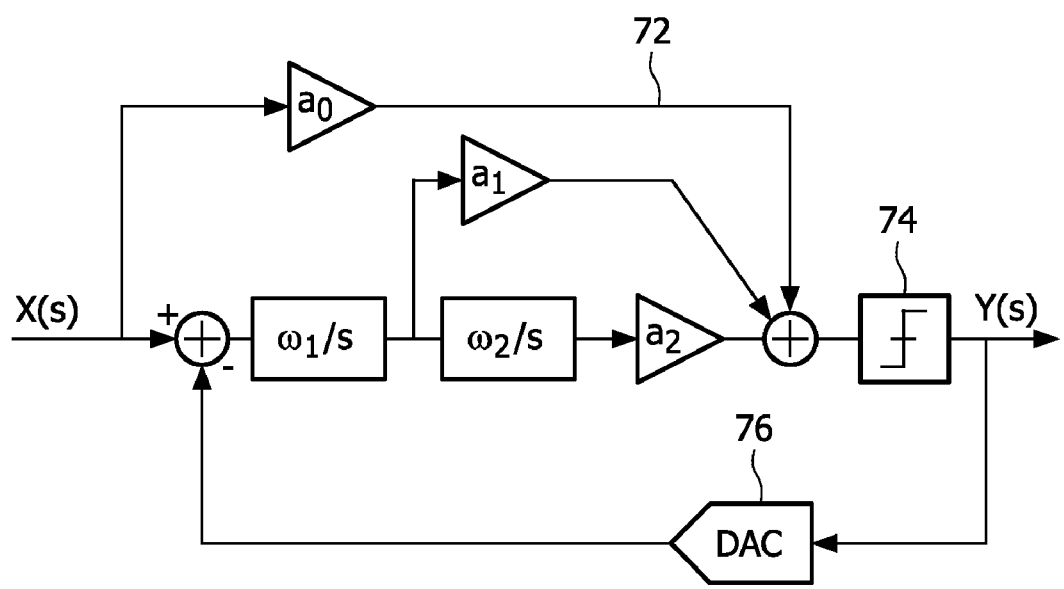
FIG. 5 shows a schematic functional block diagram of a sigma-delta ADC topology according to a first preferred embodiment.

FIG. 5 shows a schematic functional diagram of a sigma-delta ADC topology according to the first preferred embodiment with a continuous-time filtering feedforward structure.

In a sigma-delta ADC, dominant non-linearities are caused by the feedback path and the input stage. In the feedback path, excellent linearity can be achieved using a single-bit DAC 76 in combination with return-to-zero pulses.

Feedforward compensation is achieved by a loop filter, e.g., a $2^{nd}$ order loop filter with coefficients $A_1$ and $A_2$ and characteristic angular frequencies $\omega_1$ and $\omega_2$. The feedforward technique enables an inherently low-power modulator while feedback compensation would result in a favorable signal transfer function in view of immunity to interferers.

The present feedforward compensation by the loop filter may be enhanced by an additional feedback compensation.

In the example of FIG. 5, the 2nd order loop filter is arranged so that, at high frequencies, the path $A_1\omega_1/s$ overrules the other contribution or term and ensures stability. A second characteristic of the sigma-delta ADC topology is the fact that only an error signal (i.e., the difference between input $X(s)$ and output $Y(s)$) is fed into the 2nd order loop filter. This signal consists primarily of quantization noise and is rather small. Therefore, the first block $\omega_1/s$ of the 2nd order loop filter can have high gain. As a consequence, the bias current of the consecutive stages can be low because, in a closed-loop configuration, their noise and distortion is suppressed by the preceding gain. Hence, the feedforward topology enables a low-power design.

In the first preferred embodiment of FIG. 5, the continuous-time feedforward sigma-delta ADC comprises an additional direct feedforward path 72 so as to achieve a merged filtering function free from overshoot. It combines features of feedforward continuous-time sigma-delta ADCs, such as anti-aliazing behavior and low-power consumption, with a filtering signal transfer function. To achieve this, the direct feedforward path 72 is adapted to create a flat signal transfer function but also to compensate for peaking of the feedforward structure while preserving first order high frequency selectivity of the feedforward topology. This leads to a new filtering feedforward sigma-delta ADC.

In particular, the direct feedforward path is optimized by introducing a direct feedforward coefficient $a_0$ to compensate for the maximum in-band RMS (Root Mean Square) input signal magnitude $Ain_{rms}$. According to the preferred embodiment, this optimization can be achieved by using the following expression:

$$a_0 = (5.10^{-2} Ain_{rms}\sqrt{2} + 0.135)5\frac{\omega_1}{mfs}a_1 \quad (2)$$

wherein mfs denotes the sampling frequency, $\omega_1$ denotes the characteristic angular frequency of the first order term of the 2nd order loop filter, $a_1$ denotes the coefficient of the first order term of the 2nd order loop filter.

The additional direct feedforward component is added to the output of the 2nd order loop filter and the resulting combined signal is supplied to a quantizer or comparator 74 which generates a digital output signal $Y(s)$ which is also supplied to the DAC 76 in the feedback path of the loop.

It is however noted that the above mentioned 2nd order loop filter may be replaced by a loop filter of different order, such as a $5^{th}$ order loop filter, for example.

Figure 6A:
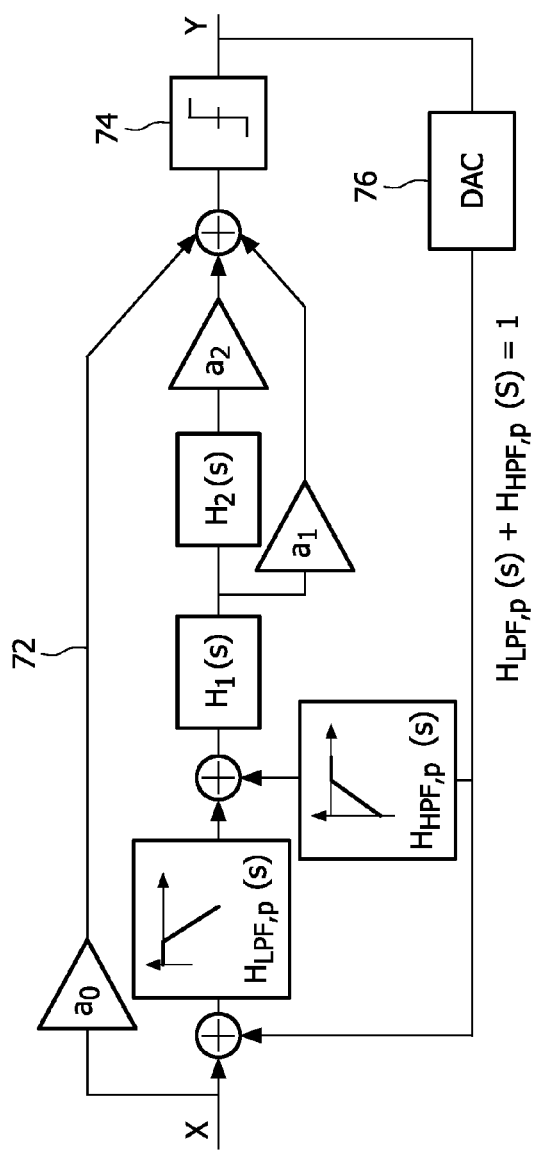
FIGS. 6(a) and 6(b) show schematic functional block diagrams of sigma-delta ADC topologies according to a second preferred embodiment.
Figure 6B:
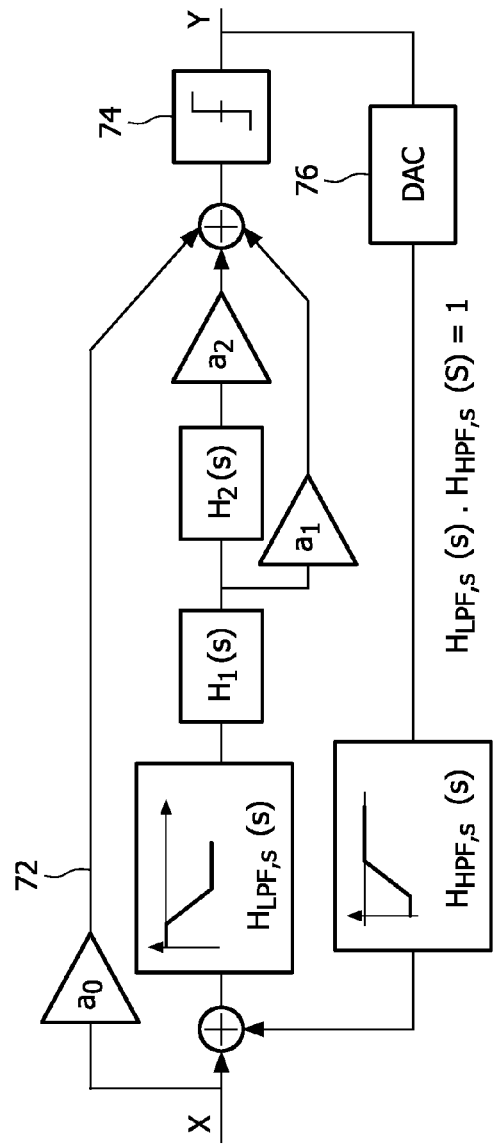

FIGS. 6(a) and 6(b) show enhanced continuous-time filtering feedforward sigma-delta ADC topologies according to the second preferred embodiment, which are based on the structure of FIG. 5, wherein however additional low-pass and high-pass filters have been introduced in the feedback path and the forward path. In particular, a low-pass filter (LPF) has been added in the forward pass and a high-pass filter (HPF) has been added in the feedback path of the ADC loop. Thereby, interferer immunity can be enhanced.

The upper circuit of FIG. 6(a) relates to a parallel topology, while the lower circuit of FIG. 6(b) relates to a series topology. In the parallel topology, the filter characteristics may be selected to satisfy the equation $H_{LPF,p}(s)+H_{HPF,p}(s)=1$. On the other hand, the filter characteristics of the series topology may be adapted to satisfy the following equation $H_{LPF,s}(s)\cdot H_{HPF,s}(s)=1$, where $H_{LPF,s}(s)$ and $H_{HPF,s}(s)$ denote respective filter functions of the low-pass and high-pass filters. Additionally, the index i=s indicates the series topology and the index i=p indicates the parallel topology.

In the topologies of FIGS. 6(a) and 6(b) according to the second preferred embodiment, the optimized value of the direct feedforward coefficient $a_0$ is divided by two compared to its value of FIG. 5 to preserve high frequency stability of the loop, which may be influenced by the introduction of the low-pass and high-pass filters.

The characteristic frequencies or cut-off frequencies of the first order high-pass and low-pass filters of FIGS. 6(a) and 6(b) may be identical (e.g. 500 kHz) and selected to provide trade-off between out-of-band selectivity and group delay variation in the bandwidth.

In both first and second embodiments shown in FIGS. 5, 6(a) and 6(b), the new direct feedforward path 72 is only effective at low frequencies, while it can be neglected at high frequencies. This is achieved by proper selection of the direct feedforward coefficient $a_0$.

Figure 7:
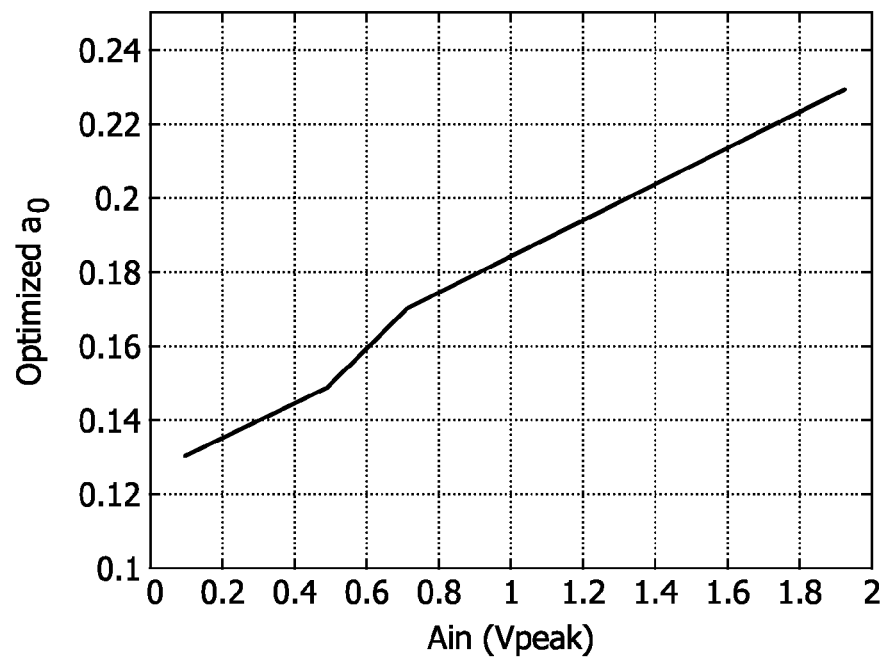
FIG. 7 shows a diagram indicating optimized values of a direct feedforward coefficient in dependence on the input signal magnitude.

As an example, FIG. 7 shows a diagram indicating a curve of optimized values of the direct feedforward coefficient $a_0$ for different input signal magnitudes Ain in case of a 5th order continuous-time loop filter when $\omega_1=2*\pi*208$ krad/s, mfs=13 MHz, and $a_1=2$. This leads to a value $a_0=0.19$ at Ain=0.8 $V_{RMS}$, for example.

Figure 8:
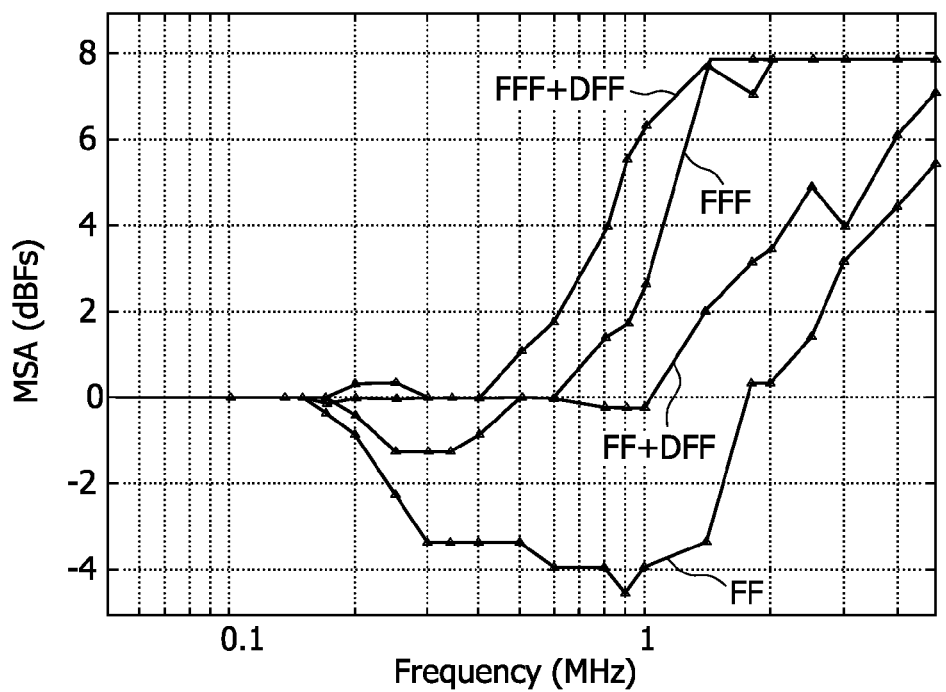
FIG. 8 shows a frequency diagram indicating the maximum stable amplitude at the ADC input vs. signal frequency when considering and ADC designed for GSM/EDGE applications.

FIG. 8 shows a frequency diagram of the maximum stable amplitude (MSA) of the input signal for different topologies. The upper curve "FFF+DFF" relates to the filtering feedforward topology of the second preferred embodiment with additional high-pass and low-pass filters. The second topology "FFF" relates to the second preferred embodiment without the proposed direct feedforward path 72. The third topology "FF+DFF" relates to the first preferred embodiment, and the fourth topology "FF" relates to the conventional topology depicted in FIG. 3.

The curves of FIG. 8 are based on transient simulation results of a sigma-delta ADC for GSM/EDGE systems. In case of a 5th order continuous-time loop filter with $\omega_1=w1=2*\pi*208$ krad/s, mfs=13 MHz, and $a_1=2$, the optimized values for the direct feedforward coefficient $a_0$ at Ain=0.8 $V_{RMS}$ is 0.19 for the topology of FIG. 5 and 0.19/2=0.095 for the topology of FIG. 6. As can be gathered from FIG. 8, transient simulation of the filtering feedforward topology "FFF" of the second preferred embodiment without the proposed direct feedforward coefficient does not completely suppress the peaking, since the maximum stable amplitude (MSA) at 200 kHz is reduced by 1.3 dB. The new topology of the second preferred embodiment "FFF+DFF" enables, on one hand, to suppress the peaking and, on the other hand, to significantly improve the selectivity of the topology above 400 kHz. The limitation indicated by the arrow in FIG. 8 is caused by supply voltage clipping. Nevertheless, even in the first embodiment of FIG. 5, (topology "FF+DFF") significant improvements can be achieved with respect to the respective conventional topology "FF" of FIG. 3.

Figure 9:
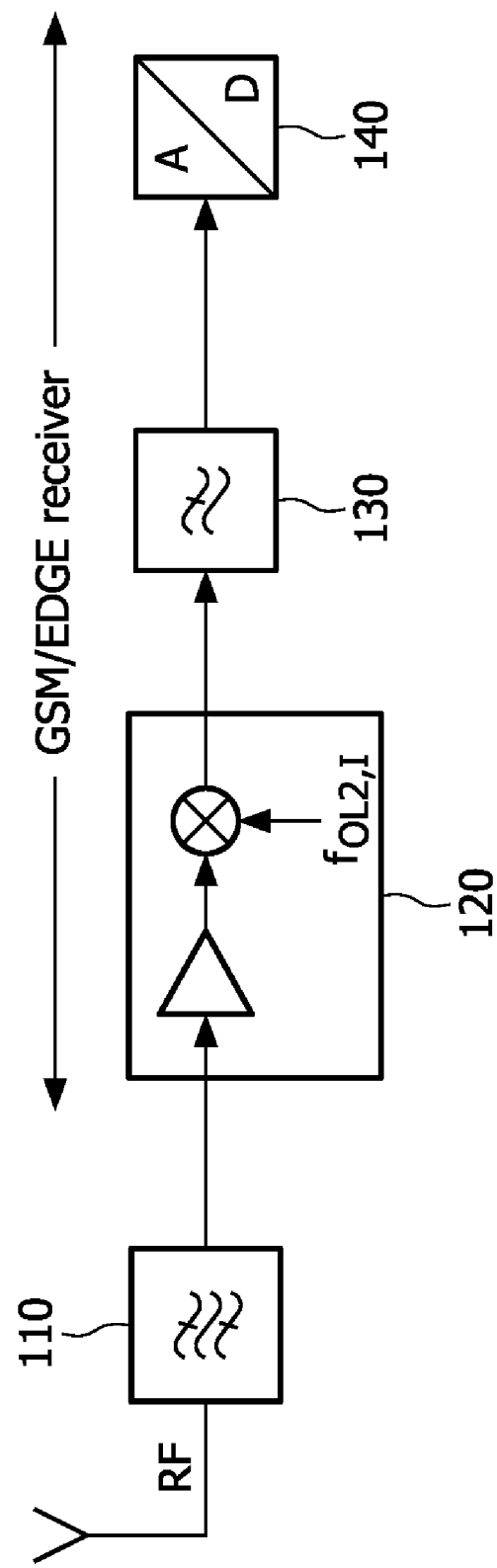
FIG. 9 shows a schematic block diagram of a receiver architecture in which the present invention is implemented.
Figure 10:
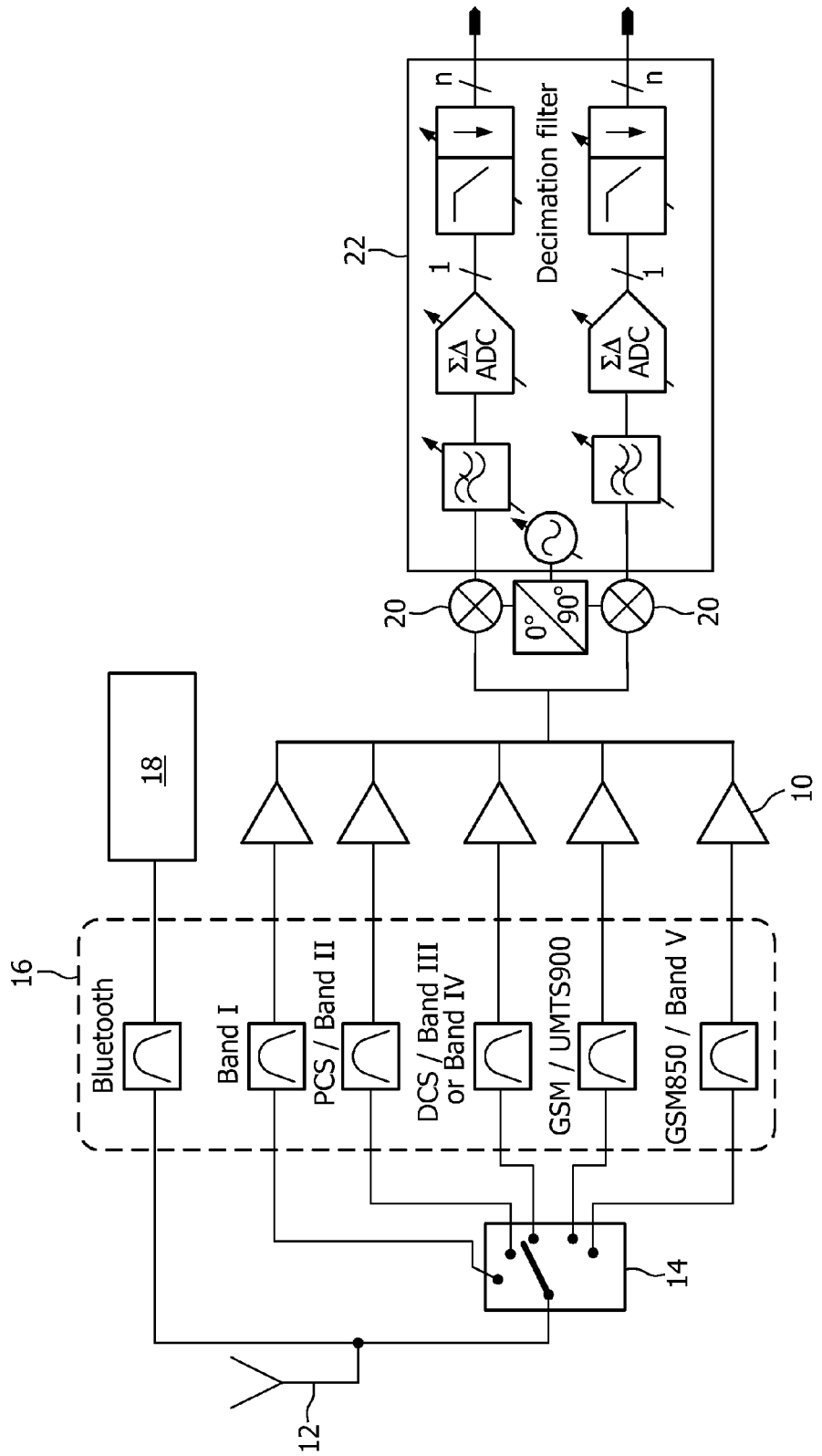
FIG. 10 shows a multi-mode/multi-band receiver concept built on multi-band antenna.

FIG. 9 shows an example of an application of the proposed sigma-delta ADC topology in a GSM/EDGE receiver or any other wireless and wired receiver. As external components, an RF antenna and a front-end filter 110 with antenna switch are provided. The signal passed through the front-end filter 110 is supplied to an RF amplifier and mixer circuit 120 of the GSM/EDGE receiver. The converted output signal is supplied to an analog pre-filter 130, which can be a first order low-pass filter due to the relaxed pre-filter requirements achieved by the topology of the proposed sigma-delta ADC 140. The simple first order low-pass filter 130 may have a 3 dB cut-off frequency of 250 kHz, while no analog automatic gain control (AGC) is required. Compared to conventional feedforward topology as depicted for example in FIG. 3, the proposed feedforward filtering sigma-delta ADC topologies according to the first and second preferred embodiments can be used in combination with a first order low-pass filter 130, which will result in smaller analog pre-filtering and increased robustness to the adjacent first alternate and 3 MHz blocker.

Thus, when properly scaled, at high frequency, the proposed topologies according to the first and second preferred embodiments provide improved interferer immunity in the sense that the allowable out-of-band input level can be greater than the in-band signal while preserving loop stability.

The sigma-delta ADC 140 can thus be arranged closer to the RF amplifier and mixer circuit 120, since the area of analog pre-filtering in front of the sigma-delta ADC 140 can be reduced. This is especially the case for low bandwidth applications such as GSM which need low frequency filtering and consequently high capacitor values. Thereby, a highly digitized architecture with sigma-delta ADC 140 and improved immunity to interferers can be obtained.

It is noted that the proposed additional direct feedforward path 72 with optimized direct feedforward coefficient can be implemented in any RF or wireless application to suppress out-of-band overshoot or peaking while preserving filtering capabilities. In particular, the feedforward structure of FIGS. 6, 6(a) and 6(b) may be replaced by other feedforward structures of different order.

The following preferred embodiments are adapted to provide anti-aliazing properties of continuous direct feedforward sigma-delta ADCs. As a result, anti-aliazing filtering in front of the sigma-delta ADC can be discarded as well as RF filtering requirement at mfs frequency offset from the wanted RF carrier.

A quantitative analysis of the alias suppression of the direct feedforward topology is conducted and some AC simulations results of a $5^{th}$ order 1-bit continuous direct feedforward sigma-delta ADC designed for a UMTS ZIF receiver with mfs=312 MHz, bandwidth BW=2 MHz per ADC, i.e., 4 MHz for combined I & Q ADC, are presented.

Figure 3:
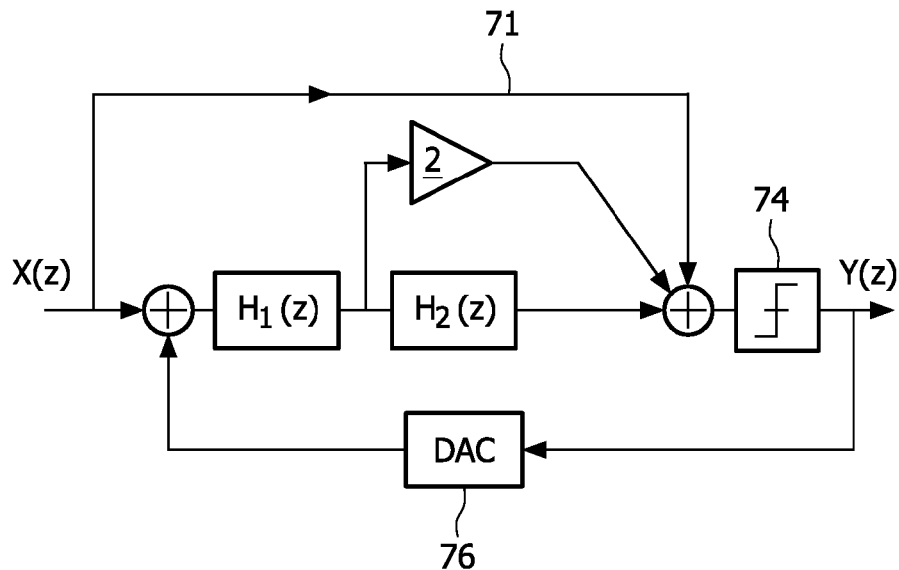
FIG. 3 shows a schematic functional block diagram of a known sigma-delta ADC topology with reduced distortion.
Figure 4:
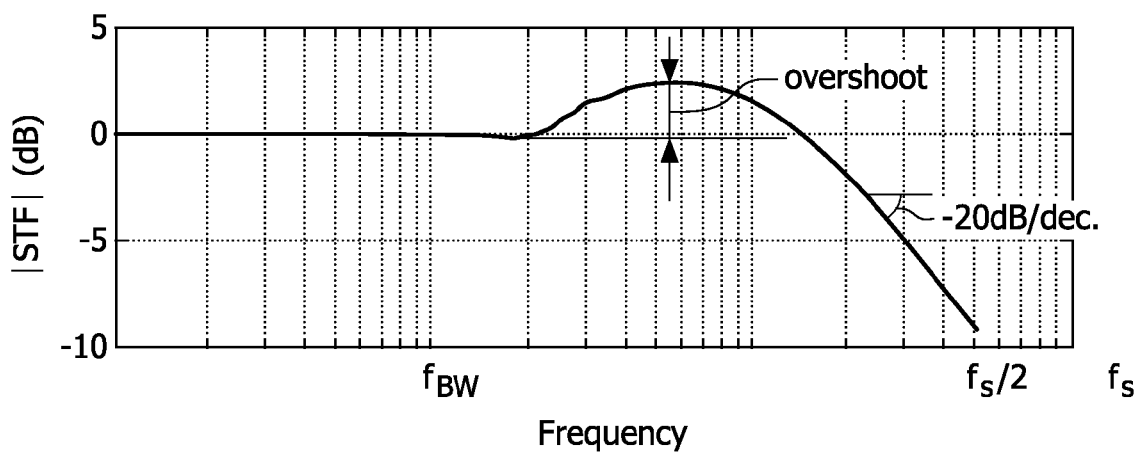
FIG. 4 shows a frequency diagram with a typical signal transfer function of a feedforward topology.
Figure 12A:
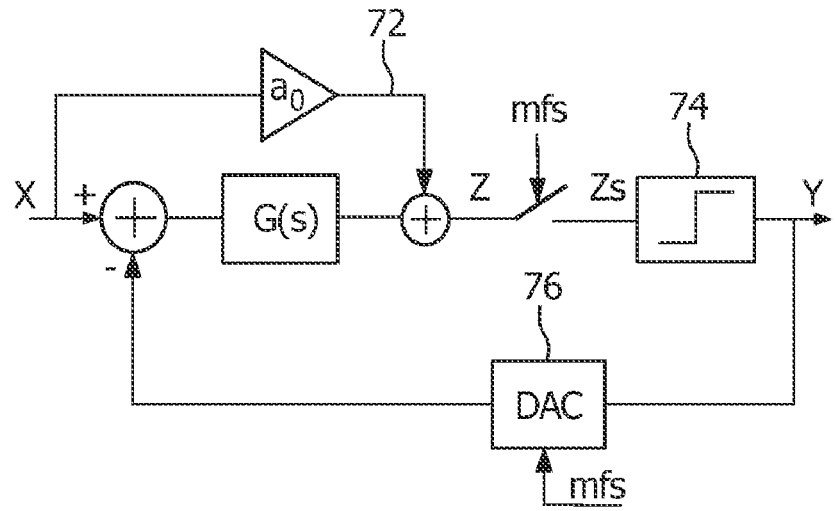
FIG. 12(a) shows a schematic block diagram of a 1-bit continuous direct feedforward sigma-delta modulator, and FIG. 12(b) a linearized equivalent circuit thereof.
Figure 12B:
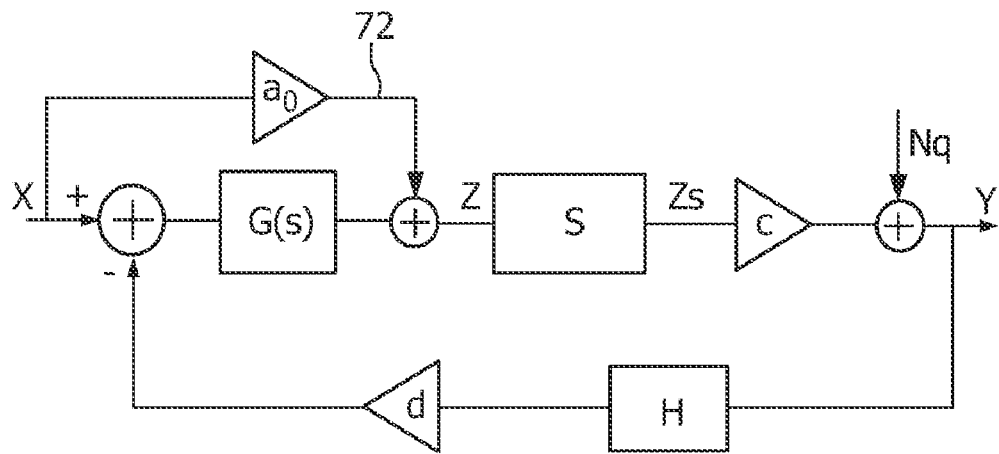

FIG. 12(a) shows a schematic block diagram of a 1-bit continuous direct feedforward sigma-delta modulator similar to FIG. 3, and FIG. 12(b) its linearized equivalent circuit with a sample circuit S, amplifiers c and d and a hold circuit H. It is supposed that an interferer at a frequency mfs-$\Delta$f near the sample frequency mfs is applied to the sigma-delta ADC. Typically, the unity gain frequency of G(s) is at $\frac{1}{6}^{th}$ of the sample rate mfs for stability reasons. This implies that the feedback is not effective anymore at the interferer frequency and the feedback path can be neglected.

Figure 13A:
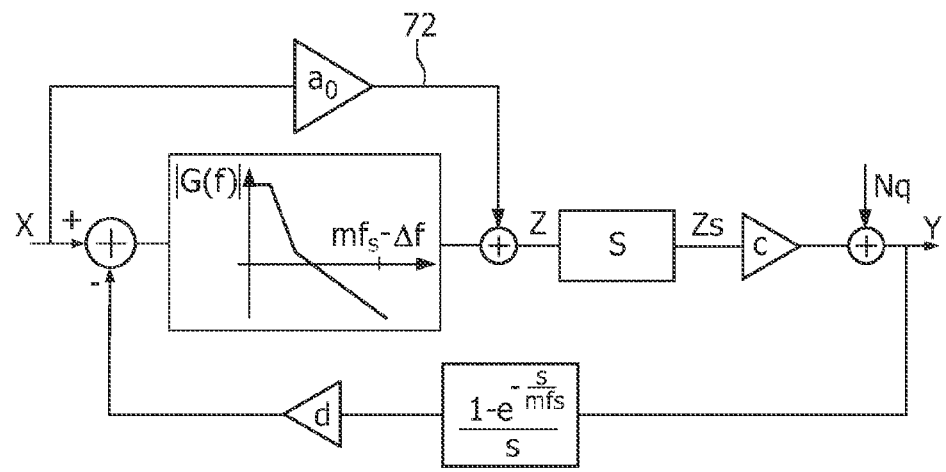
FIG. 13(a) shows a schematic block diagram of a linearized continuous direct feedforward sigma-delta ADC.
Figure 13B:
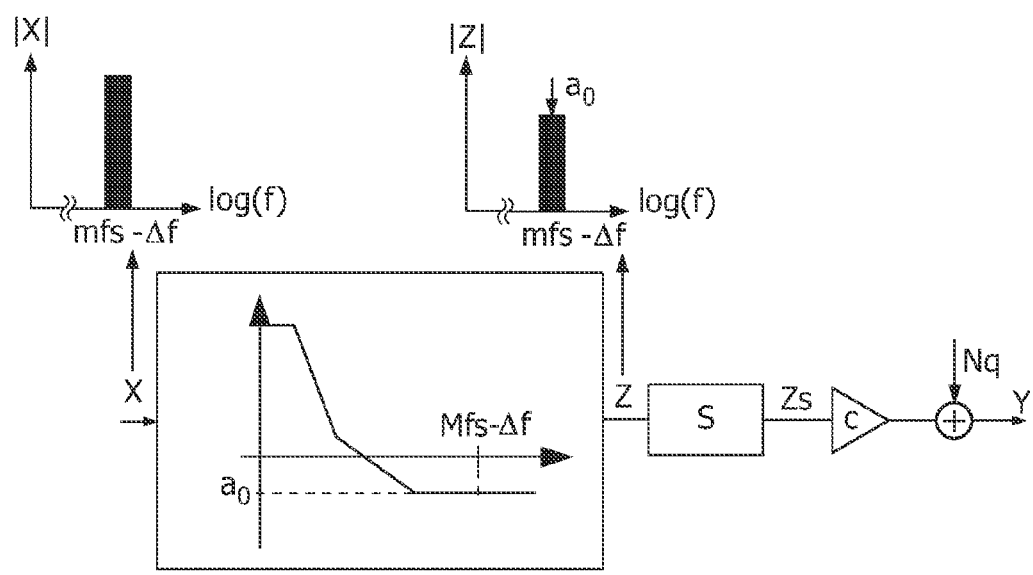
FIG. 13(b) shows an equivalent block diagram thereof.

FIG. 13(a) shows a schematic block diagram of a linearized continuous direct feedforward sigma-delta ADC and FIG. 13(b) shows an equivalent block diagram of the feedforward attenuation at frequency mfs-$\Delta$f with neglected feedback path. The interferer is attenuated by the loop filter magnitude response:

$$\left|\frac{Z(mfs-\Delta f)}{X(mfs-\Delta f)}\right| = |a_0 + G(mfs-\Delta f)| \quad (3)$$
$$= a_0 + |G(mfs-\Delta f)|$$

Consecutively, the interferer is sampled in the quantizer 74. This introduces an alias $Z_s$ at $\Delta$f as shown in FIG. 14(a).

Figure 14A:
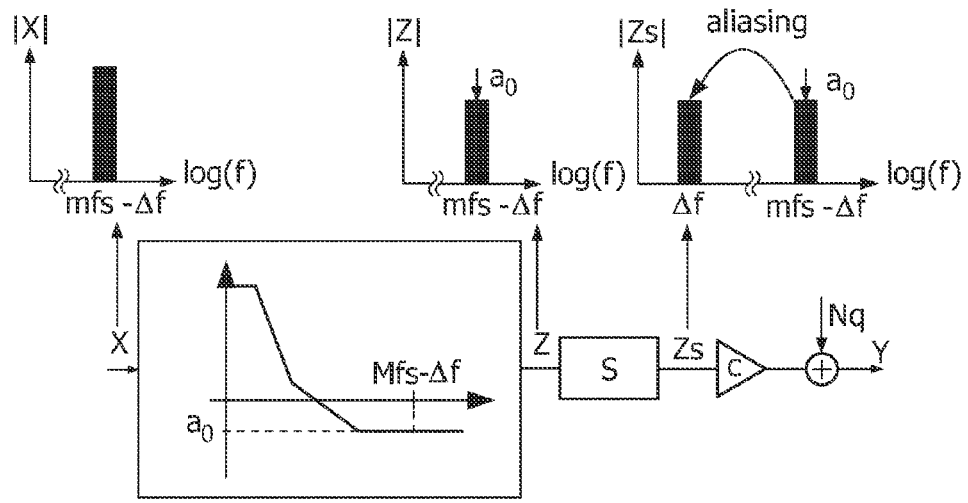
FIG. 14(a) shows a schematic block diagram of an aliazing mechanism, and FIG. 14(b) a schematic block diagram indicating alias suppression.
Figure 14B:
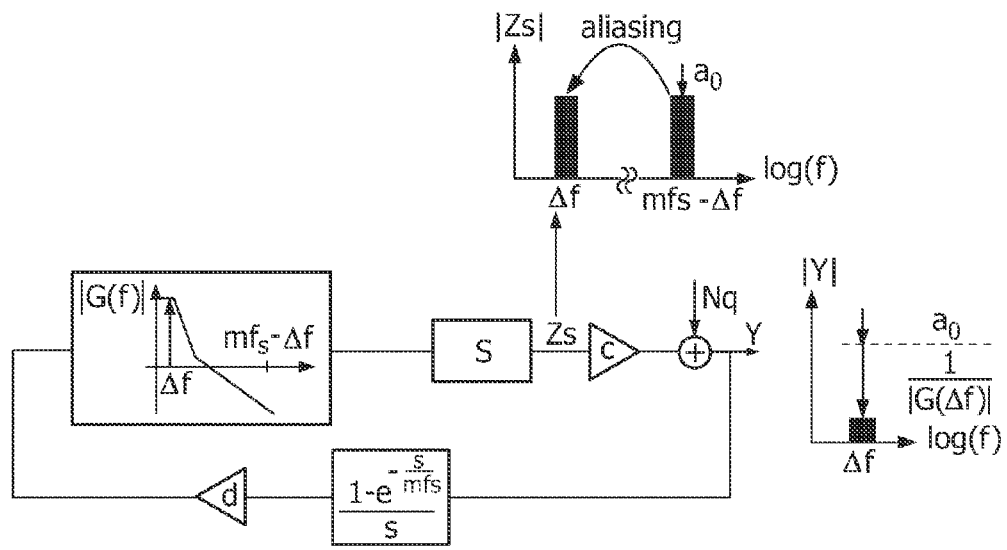

FIG. 14(a) shows a schematic block diagram of an aliazing mechanism, and FIG. 14(b) a schematic block diagram indicating alias suppression in a continuous time direct feedforward sigma-delta ADC. Fortunately, this alias $Z_s$ is suppressed towards the output due to the high preceding loop gain at frequency $\Delta$f:

$$|G(\Delta f)| \gg 1 \quad (4)$$

In addition, the overall feedback transfer function at $\Delta f \ll mfs$ can be expressed as follows:

$$|H(s)|_{s=j2\pi\Delta f} = \left| d \cdot \frac{1 - e^{\frac{-j2\pi\Delta f}{mfs}}}{j2\pi\Delta f} \right| \quad (5)$$
$$\approx \left| d \cdot \frac{1 - (1 - j2\pi\Delta f)}{j2\pi\Delta f} \right|$$
$$= d$$

Therefore, the (approximate) transfer of the alias $Z_s(\Delta f)$ towards the output $Y(\Delta f)$ of the ADC can be calculated from the simple linearized model of FIG. 14(b). This leads to the overall equation:

$$\left|\frac{Y(\Delta f)}{Z_s(\Delta f)}\right| = \left|\frac{c \cdot [a_0 + G(mfs-\Delta f)]}{1 - cdG(\Delta f)}\right| \quad (6)$$

As illustrated in FIG. 14(a), at frequency mfs-$\Delta$f, the loop filter gain |H(mfs-$\Delta$f)| is expected to be much smaller than the direct feedforward coefficient value $a_0$. Therefore the following relationship holds:

$$|a_0 + H(mfs-\Delta f)| \approx a_0 \quad (7)$$

Combining equations (3) to (7) and assuming d<<H($\Delta$f) in the bandwidth, the analytical alias suppression expression becomes:

$$\left|\frac{Y(\Delta f)}{Z_s(\Delta f)}\right| \approx -\frac{a_0}{|H(\Delta f)|} \quad (8)$$

According to equation (8), the alias suppression does not depend on the gain of the quantizer 74. Consequently, the number of quantization bits has no influence on the anti-aliazing property of a continuous time direct feedforward sigma-delta ADC.

The alias suppression expression in dB is given by:

$$AS_{dB} \approx 20 \cdot \log 10\left(\frac{|H(\Delta f)|}{a_0}\right) \quad (9)$$

Figure 15:
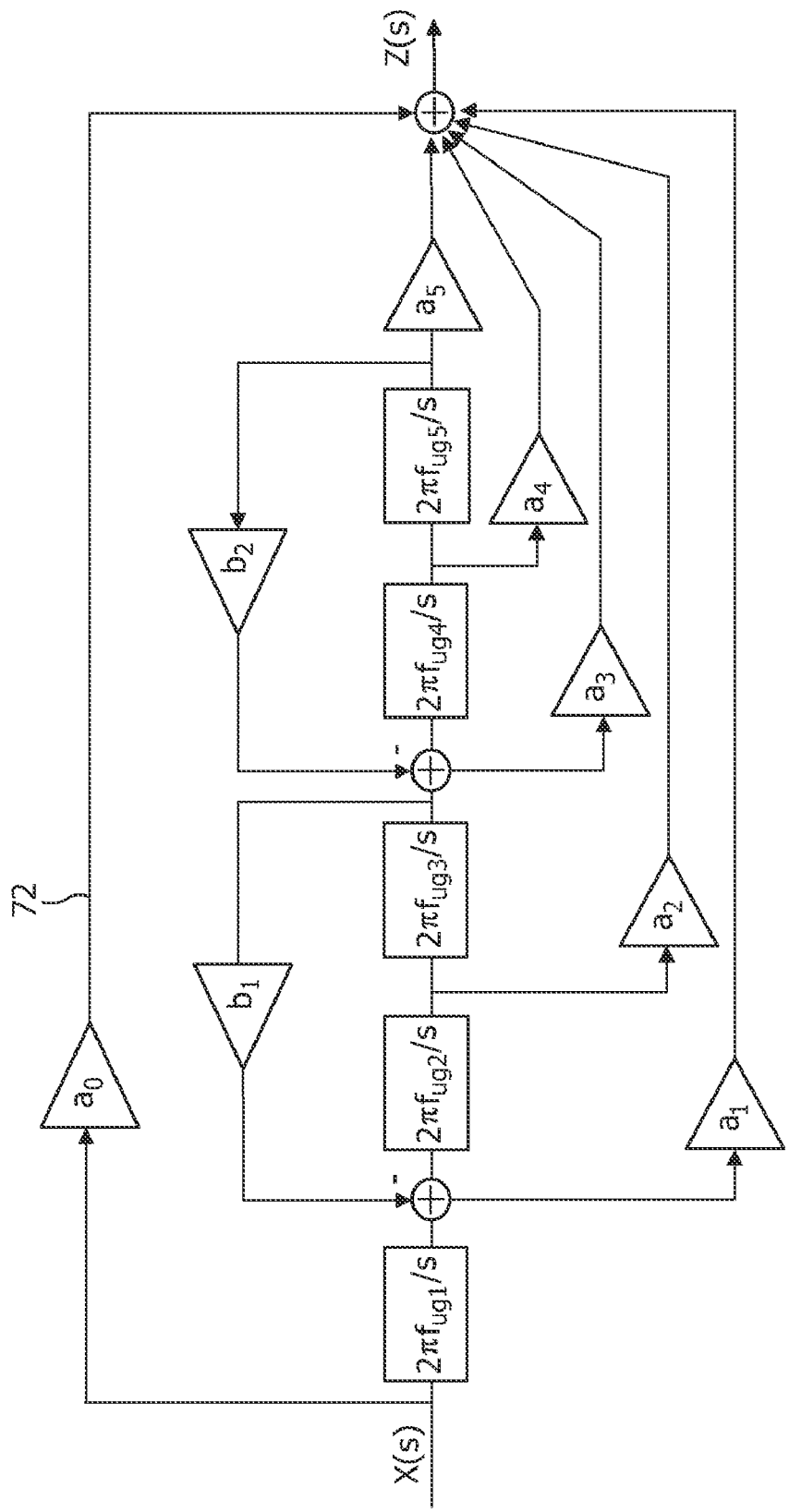
FIG. 15 shows a schematic block diagram of a linearized forward path with a $5^{th}$ order loop filter.

To gain more insight in equation (9), it is useful to simulate the optimized $a_0$ coefficient combined with the linear transfer function of the feedforward $5^{th}$ order loop filter depicted in FIG. 15.

FIG. 15 shows a schematic block diagram of a linearized forward path with the $5^{th}$ order loop filter. The optimized $a_0$ is computed based in equation (2):

$$a_0 = (5.10^{-2} Ain_{rms}\sqrt{2} + 0.135)5 \cdot \frac{2 \cdot \pi fug_1}{mf_s} \cdot a_1 \quad (10)$$

where $fug_1$ is the unity gain frequency of the $1^{st}$ integrator.

When $fug_1$=9.93 MHz, $mf_s$=312 MHz, $a_1$=2 and the maximum signal magnitude at the ADC input is 0.5Vrms, then the optimized values for $a_0$ is 0.34 (i.e., 20.log 10(0.34)=−9.37 dB).

It is to be noted that the simulated loop filter has two complex conjugate poles introduced by the local feedback coefficients b1, b2.

Figure 16:
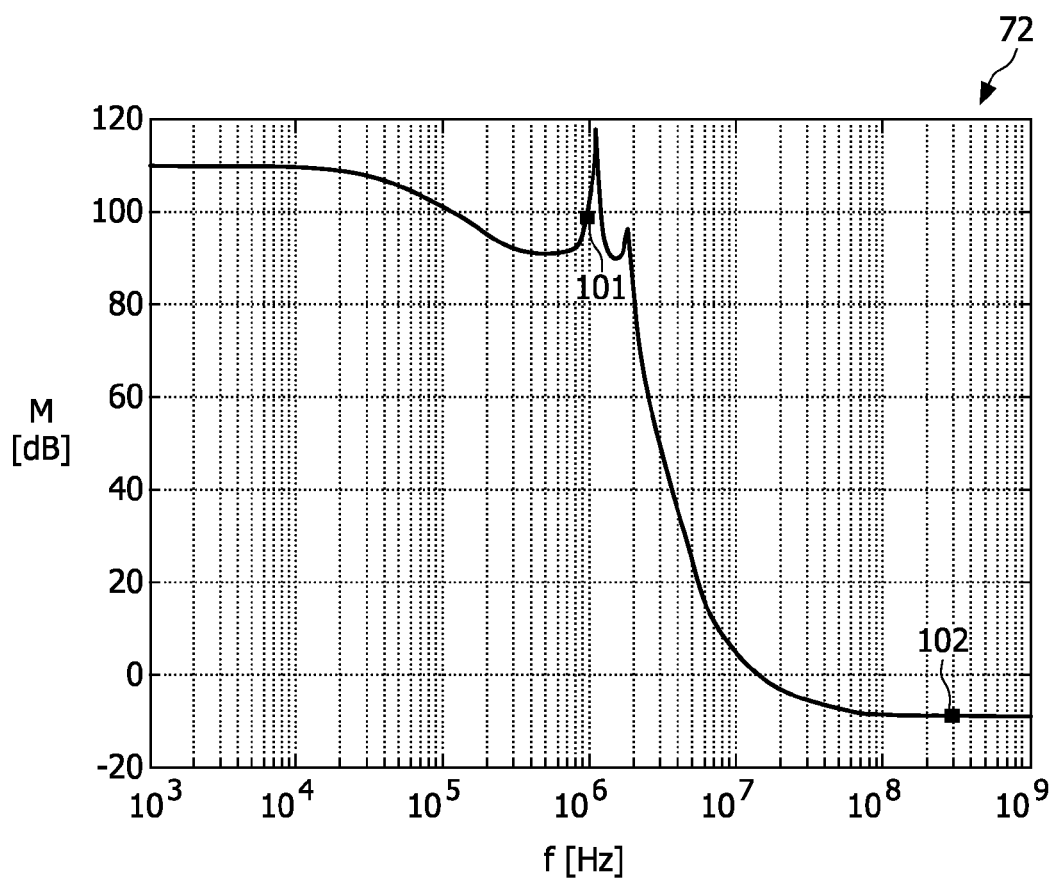
FIG. 16 shows a Bode diagram of a direct feedforward loop.

FIG. 16 shows a Bode diagram of the direct feedforward loop when the finite DC gain of each integrator is 50 dB and for $a_0$=0.34. The two complex conjugate poles introduced by the above local feedback coefficients b1, b2 appear as peaks in the frequency domain. The marked point 101 in FIG. 16 corresponds to a frequency of 1 MHz with a magnitude of 98.2 dB, and the other marked point 102 corresponds to a frequency of 311 MHz with a magnitude of −9.32 dB.

According to equation (9) and points 101 and 102 in FIG. 16, the alias suppression is expected to be: 98.2+9.32=107.52 dB.

Some transient simulations of the non-linearized continuous time and discrete time direct feedforward sigma-delta ADC has been performed to validate the linear modeling and assumptions made above. A simulation has been conducted for an input signal frequency $mfs-\Delta f$=311 MHz at an amplitude of 0.5Vrms and a sampling frequency $mfs$=312 MHz. The alias component at $\Delta f$=1 MHz was clearly visible for the discrete time and continuous time direct feedforward sigma-delta ADCs. In the discrete time topology the alias was not suppressed at all, whereas in the continuous time topology, the alias was suppressed by 120.1−12.87=107.23 dB, which is in agreement with the expected value of 107.52 dB derived from the linear analysis.

These simulation results fully validate the anti-aliazing property of the continuous time direct feedforward sigma-delta ADC.

Thus, continuous time direct feedforward topology provides some significant alias filtering, so that conventional anti-aliasing filters can be discarded. The alias suppression depends on the direct feedforward coefficient value $a_0$, in a sense that a smaller $a_0$ leads to a stronger alias suppression.

Although a W-CDMA (Wideband CDMA) case has been used above to illustrate the anti-aliasing properties of the continuous time direct feedforward topology, it is to be noted that the anti-aliasing properties are valid for any standard or system (GSM/EDGE, DECT, 3G, DVB-H, WLAN, GPS, etc.), application (wireless, wired), and digitization domain (RF, IF, BB).

The anti-aliasing property enables to discard the conventional anti-aliasing filter in front of the ADC and to relax filter band attenuation at the offset frequency mfs. Moreover, the number of quantization bits does not influence the AA property. Thereby, Localization of the ADC can be arranged closer to the mixer as a result of anti-aliasing filter suppression, and the area of analog pre-filtering in front of the ADC can be reduced, The proposed ADC can be used in any handset where several different application (3G and Bluetooth (BT) or WLAN (Wireless Local Area Network) for instance) co-exist and run at the same time.

The local feedback coefficients $b_i$ enable to increase the RMS gain of the loopfilter transfer function in the bandwidth, which give more anti-aliazing suppression.

The alias suppression expressed in dB has been defined in equation (9). Therefore, the anti-aliazing suppression is frequency dependant, since the loop filter gain H(f) is frequency dependant. Thus, the higher the DC gain the better the alias rejection.

In the following, different implementations of anti-aliasing filters according to third to sixth preferred embodiments are introduced for a single-loop ADC topology. All of the following preferred embodiments represent a $5^{th}$ order loop filter with two local feedback circuits. It is of importance to note that the loop filter could be a $2^{nd}$, $3^{rd}$, $4^{th}$, $5^{th}$ or higher order loop filter as well.

FIG. 17 shows a schematic circuit diagram of an anti-aliazing filter 150 according to the third preferred embodiment based on an OTA-RC (Operational Transconductance Amplifier-Resistor Capacitor) integrator with purely resistive feedforward coefficient. This embodiment supports low supply voltage (required in deep-submicron technologies) combined with high linearity performance. The feedforward coefficient resistance is always constant regardless of the input signal frequency, which is desirable for multi-standard application.

FIG. 18 shows a schematic circuit diagram of an anti-aliazing filter 160 according to the fourth preferred embodiment based on an OTA-RC integrator with purely capacitive feedforward coefficient. This topology is suited for low supply voltage combined with high linearity performance. The equivalent feedforward coefficient capacitance is changing with the input signal frequency. In addition, the feedforward capacitance adds some additional capacitive load and thus increases the current consumption of the OTA-RC integrators.

Figure 19:
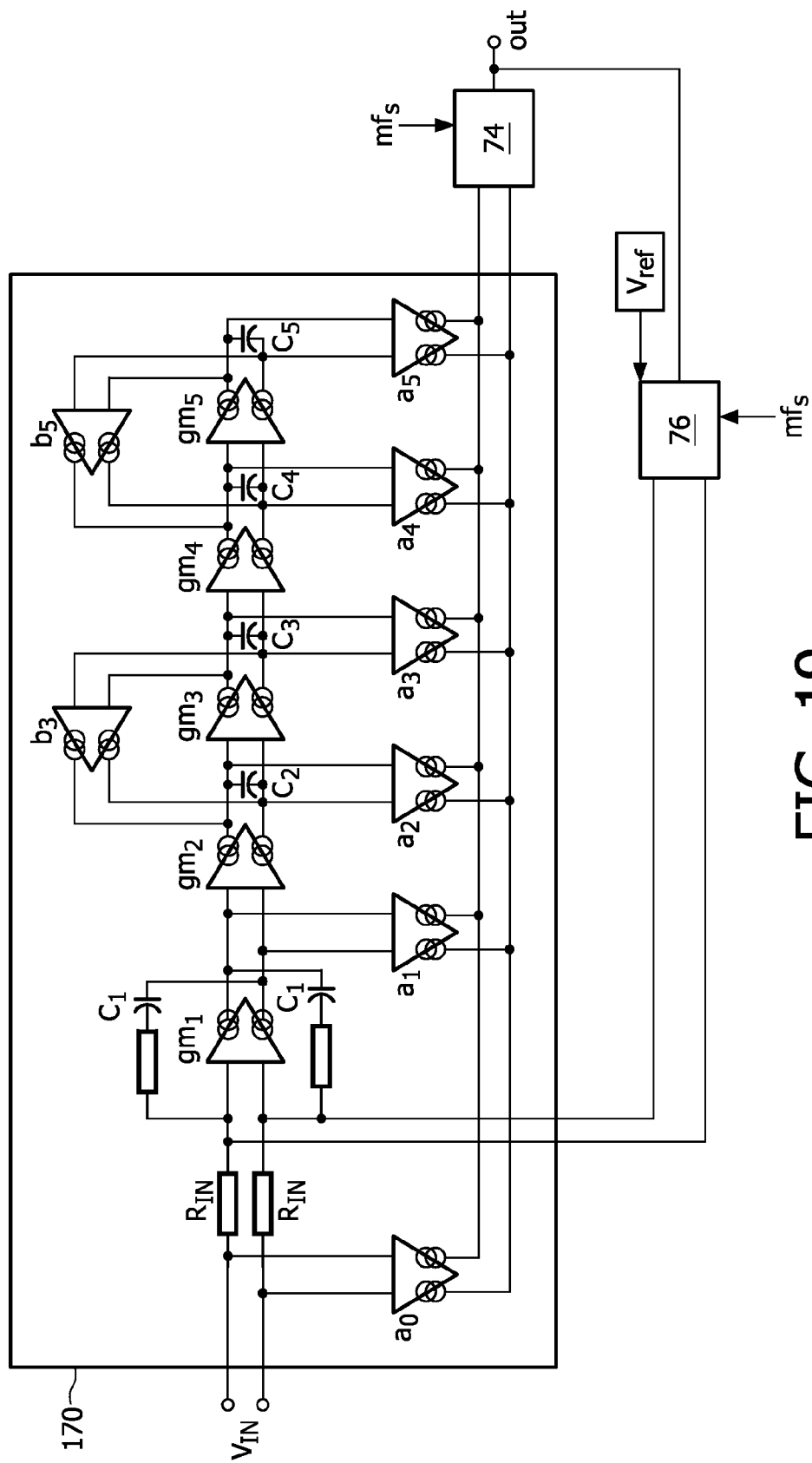
FIG. 19 shows a schematic circuit diagram of an anti-aliazing filter according to a fifth preferred embodiment.

FIG. 19 shows a schematic circuit diagram of an anti-aliazing filter 170 according to the fifth preferred embodiment based on OTA-RC integrator for the $1^{st}$ integrator and Gm-C topology for $2^{nd}$ up to the $5^{th}$ integrator. It is noted that the feedforward coefficient is implemented with some transconductance in this case. This solution enables moderate voltage operation (not lower than 1.8V) but provides trade-off between the linearity requirement in the $1^{st}$ stage by using an OTA-RC structure and power consumption by using Gm-C integrators with lower linearity requirements, which is typically the case for the $2^{nd}, \ldots, 5^{th}$ integrators.

FIG. 20 shows an example of a cascaded loop implementation based on a MASH-22 topology that is obtained by cascading two second-order single loops, wherein "MASH" is an acronym for Multi-stage noise shaper. MASH-22 means that the ADC topology is built with a 2 stage noise shaper and each stage is a 2nd order noise shaper. In particular, MASH-211 means that the ADC topology is built with a 3 stage noise shaper. The first stage is a 2nd order noise shaper, whereas the 2nd and 3rd stages are first order noise shapers. It is worth noting that the cascaded loop implementation may as well be based on MASH-11, MASH-12, MASH-21, MASH-211, etc. The MASH-22 cascade loop of FIG. 20 comprises an anti-aliazing filter 180 according to the sixth preferred embodiment based on an OTA-RC integrator with purely resistive feedforward coefficient.

Here, a full OTA-RC implementation is represented. It is however noted that, as in the previous single loop cases, a mixed of OTA-RC and gm-C implementation may be provided as well, wherein gm-C is a structure that is used to built integrators. The term "gm" stand for transconductance and "C" for capacitance. Its unity gain frequency (frequency value where the gain of the integrators is 1 or 0 dB) is expressed by fug=gm/(2*π*C).

FIG. 21 shows a table listing situations for possible anti-aliasing loop filter implementations with first and second stages each comprising first and second integrators. However, all intermediate solution can be used as well. The fully OTA-based implementation provides the advantage of low voltage and high linearity, while the gm-C-based implementation with OTA-based first integrator enables moderate voltages and low power consumption.

The proposed local feedback provides increased anti-aliazing properties which are also suitable for broadcast television (TV) and especially TV-on-Mobile standards (DVB-H/T, T-DMB, ISDB-T etc. . . . ) where co-existence with cellular is a severe issue.

In summary, a receiver apparatus, ADC apparatus and method have been described, in which an analog input signal is converted into a digital output signal, wherein an additional direct feedforward path (72) is introduced to compensate for peaking of feedforward structures while preserving frequency selectivity of the feedforward topology. In particular, the direct feedforward path (72) is provided with a scaling functionality by a direct feedforward coefficient ($a_0$) less than one and greater than zero. As a result, overshoot or peaking of classical feedforward topologies can be suppressed while providing interferer immunity, anti-aliazing effects and loop stability.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. An analog-to-digital converter (ADC) apparatus for converting an analog input into a digital output signal, said ADC apparatus comprising:
   feedforward means for processing a derived signal according to a predetermined filtering function to obtain a processed signal;
   compensating means for receiving said analog input signal and for generating a compensation signal to be combined with said processed signal to obtain a combined signal;
   single-bit or multi-bit quantizer means for converting said combined signal into said digital output signal;
   feedback means for generating an analog feedback signal by digital-to-analog converting said digital output signal, and for subtracting said analog feedback signal from said analog input signal to obtain said derived signal; and
   anti-aliasing filter means for suppressing alias signals, wherein alias suppression of said anti-aliasing filter means is set by a scaling coefficient less than one and greater than zero,
   wherein said compensating means comprise scaling means for scaling said analog input signal by applying said scaling coefficient to generate said compensation signal.

2. The apparatus of claim 1, wherein said compensating means comprise a direct feedforward path.

3. The apparatus of claim 1, wherein said filtering function of said feedforward means has a low-pass characteristic.

4. The apparatus of claim 1, wherein said scaling coefficient is optimized according to the following expression:

$$a_0 = (5.10^{-2} Ain_{rms}\sqrt{2} + 0.135)5\frac{\omega_1}{mfs}a_1$$

wherein $Ain_{rms}$ denotes the maximum in-band RMS input signal, $\omega_1$ denotes the characteristic angular frequency of a first order term of said filtering function, $a_1$ denotes the coefficient of said first order term of said filtering function, and mfs denotes a sampling frequency of said ADC apparatus.

5. The apparatus of claim 1, further comprising at least one of high-pass filter means for filtering said analog feedback signal and low-pass filter means for filtering said derived signal.

6. The apparatus of claim 5, wherein said high-pass filter means and said low-pass filter means have the same cut-off frequency.

7. The apparatus of claim 1, wherein said anti-aliasing filter means comprise a fifth order loop filter.

8. The apparatus of claim 1, wherein said anti-aliasing filter means are based on at least one of an OTA and a gm-C topology.

9. The apparatus of claim 1, wherein said anti-aliasing filter means has a purely resistive or a purely capacitive feedforward coefficient.

10. The apparatus of claim 1, wherein said anti-aliasing filter means is based on a cascaded loop implementation.

11. The apparatus of claim 1, wherein said ADC apparatus is a sigma-delta ADC.

12. The apparatus of claim 1, wherein said ADC apparatus is implemented in discrete or continuous-time topology.

13. A receiver apparatus comprising the ADC apparatus of claim 1.

14. The receiver apparatus of claim 13, wherein said receiver apparatus is a multi-band receiver for combined reception of cellular and other wireless signals.

15. A method of converting an analog input signal into a digital output signal, said method comprising:
   generating a feedforward signal by processing a derived signal according to a filtering function;
   combining said feedforward signal with a compensation signal generated from said analog input signal to obtain a combined signal;
   converting said combined signal into said digital output signal;
   generating an analog feedback signal by digital-to-analog converting said digital output signal;
   suppressing alias signals of said digital output signal by an anti-aliasing filter using a scaling coefficient less than one and greater than zero; and
   subtracting said analog feedback signal from said analog input signal to obtain said derived signal;
   wherein said compensation signal is generated by applying said scaling coefficient to said analog input signal.

16. The method of claim 15, wherein said anti-aliasing filter comprises a fifth order loop filter.

17. The method of claim 15, wherein said anti-aliasing filter is based on at least one of an OTA and a gm-C topology.

18. The method of claim 15, wherein said anti-aliasing filter has a purely resistive or a purely capacitive feedforward coefficient.

19. The method of claim 15, wherein said anti-aliasing filter is based on a cascaded loop implementation.

20. An analog-to-digital converter (ADC) apparatus for converting an analog input into a digital output signal, said ADC apparatus comprising:
   feedforward means for processing a derived signal according to a predetermined filtering function to obtain a processed signal;

compensating means for receiving said analog input signal and for generating a compensation signal to be combined with said processed signal to obtain a combined signal;

single-bit or multi-bit quantizer means for converting said combined signal into said digital output signal; and feedback means for generating an analog feedback signal by digital-to-analog converting said digital output signal, and for subtracting said analog feedback signal from said analog input signal to obtain said derived signal;

wherein said compensating means comprise scaling means for scaling said analog input signal by applying a scaling coefficient less than one and greater than zero, to generate said compensation signal, said scaling coefficient optimized according to the following expression:

$$a_0 = (5.10^{-2} Ain_{rms} \sqrt{2} + 0.135) 5 \frac{\omega_1}{mfs} a_1$$

wherein $Ain_{rms}$ denotes the maximum in-band RMS input signal, $\omega_1$ denotes the characteristic angular frequency of a first order term of said filtering function, $a_1$ denotes the coefficient of said first order term of said filtering function, and mfs denotes a sampling frequency of said ADC apparatus.

21. An analog-to-digital converter (ADC) apparatus for converting an analog input into a digital output signal, said ADC apparatus comprising:

feedforward means for processing a derived signal according to a predetermined filtering function to obtain a processed signal;

compensating means for receiving said analog input signal and for generating a compensation signal to be combined with said processed signal to obtain a combined signal;

single-bit or multi-bit quantizer means for converting said combined signal into said digital output signal;

feedback means for generating an analog feedback signal by digital-to-analog converting said digital output signal, and for subtracting said analog feedback signal from said analog input signal to obtain said derived signal; and at least one of high-pass filter means for filtering said analog feedback signal and low-pass filter means for filtering said derived signal;

wherein said compensating means comprise scaling means for scaling said analog input signal by applying a scaling coefficient less than one and greater than zero, to generate said compensation signal.

22. The apparatus of claim 21, wherein said high-pass filter means and said low-pass filter means have the same cut-off frequency.

23. A method of converting an analog input signal into a digital output signal, said method comprising:

generating a feedforward signal by processing a derived signal according to a filtering function;

combining said feedforward signal with a compensation signal generated from said analog input signal to obtain a combined signal;

converting said combined signal into said digital output signal;

generating an analog feedback signal by digital-to-analog converting said digital output signal; and subtracting said analog feedback signal from said analog input signal to obtain said derived signal, wherein said compensation signal is generated by applying a scaling less than one and greater than zero to said analog input signal, said scaling coefficient optimized according to the following expression:

$$a_0 = (5.10^{-2} Ain_{rms} \sqrt{2} + 0.135) 5 \frac{\omega_1}{mfs} a_1$$

wherein $Ain_{rms}$ denotes the maximum in-band RMS input signal, $\omega_1$ denotes the characteristic angular frequency of a first order term of said filtering function, $a_1$ denotes the coefficient of said first order term of said filtering function, and mfs denotes a sampling frequency of said ADC apparatus.

24. A method of converting an analog input signal into a digital output signal, said method comprising:

generating a feedforward signal by processing a derived signal according to a filtering function;

combining said feedforward signal with a compensation signal generated from said analog input signal to obtain a combined signal;

converting said combined signal into said digital output signal;

generating an analog feedback signal by digital-to-analog converting said digital output signal;

subtracting said analog feedback signal from said analog input signal to obtain said derived signal; and performing at least one of filtering said analog feedback signal with a high pass filter and filtering said derived signal with a low-pass filter;

wherein said compensation signal is generated by applying a scaling less than one and greater than zero to said analog input signal.

25. The method of claim 24, wherein said high-pass filter and said low-pass filter have the same cut-off frequency.

* * * * *